(12) United States Patent  
Gerowitz et al.

(10) Patent No.: US 10,585,140 B2
(45) Date of Patent: Mar. 10, 2020

(54) TESTING INTEGRATED CIRCUIT DESIGNS CONTAINING MULTIPLE PHASE ROTATORS

(71) Applicant: INTERNATIONAL BUSINESS MACHINES CORPORATION, Armonk, NY (US)

(72) Inventors: Robert G. Gerowitz, Raleigh, NC (US); Sarah B. Higgins, Chapel Hill, NC (US); Joseph A. Iadanza, Hinesburg, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 40 days.

(21) Appl. No.: 15/816,486

(22) Filed: Nov. 17, 2017

(65) Prior Publication Data

US 2018/0074121 A1    Mar. 15, 2018

Related U.S. Application Data

(62) Division of application No. 14/155,937, filed on Jan. 15, 2014, now Pat. No. 9,927,489.

(51) Int. Cl.
*G01R 31/317* (2006.01)
*G01R 25/00* (2006.01)
(Continued)

(52) U.S. Cl.
CPC ......... *G01R 31/317* (2013.01); *G01R 25/005* (2013.01); *G01R 31/31703* (2013.01);
(Continued)

(58) Field of Classification Search
CPC . H03L 7/081; H03L 7/097; H03L 7/16; H04L 1/205; H04L 1/24; H04L 7/00;
(Continued)

(56) References Cited

U.S. PATENT DOCUMENTS

| 5,245,611 A | 9/1993 | Ling et al. |
| 7,573,937 B2 | 8/2009 | Baumgartner et al. |

(Continued)

FOREIGN PATENT DOCUMENTS

| CN | 101179259 | 5/2008 |
| CN | 101510777 | 8/2009 |

(Continued)

OTHER PUBLICATIONS

Wang, H. et al., "A Wideband CMOS Linear Digital Phase Rotator," IEEE, Custom Intergrated Circuits Conference (CICC), 2007, pp. 671-674.

(Continued)

*Primary Examiner* — Young T Tse
(74) *Attorney, Agent, or Firm* — Alvin Borromeo; Andrew M. Calderon; Roberts Mlotkowski Safran Cole & Calderon, P.C.

(57) ABSTRACT

Approaches for testing phase rotators are provided. A circuit for testing phase rotators includes a compare element including a first input and a second input, wherein the compare element is configured to compare a first phase of a first signal provided at the first input to a second phase of a second signal provided at the second input. The circuit also includes a first test bus connected to the first input and a second test bus connected to the second input.

20 Claims, 25 Drawing Sheets

(51) Int. Cl.
  *G06F 17/50* (2006.01)
  *G01R 29/18* (2006.01)
(52) U.S. Cl.
  CPC ... *G01R 31/31707* (2013.01); *G06F 17/5063* (2013.01); *G01R 29/18* (2013.01)
(58) Field of Classification Search
  CPC ..... H04L 7/0008; H04L 7/0278; H04L 7/033; H04L 7/0337; H04L 7/042; G01R 25/005; G01R 25/04; G01R 29/18; G01R 31/317; G01R 31/31703; G01R 31/31706; G01R 31/31707; G01R 31/31709; G06F 17/5063
  USPC ....... 375/226, 227, 340, 371, 373, 375, 376; 327/146, 156, 236; 713/501, 503
  See application file for complete search history.

(56) References Cited

U.S. PATENT DOCUMENTS

| | | | |
|---|---|---|---|
| 7,772,900 | B2 | 8/2010 | Ainspan et al. |
| 7,907,661 | B2 | 3/2011 | Provost |
| 2001/0026179 | A1* | 10/2001 | Saeki ............... H03K 5/131 327/147 |
| 2002/0070783 | A1* | 6/2002 | Saeki ............... G06F 1/06 327/235 |
| 2004/0096024 | A1 | 5/2004 | Uchino |
| 2005/0105660 | A1* | 5/2005 | Knotts ............. H03D 13/004 375/376 |
| 2005/0110536 | A1* | 5/2005 | Ho ............... H03L 7/0891 327/156 |
| 2005/0220186 | A1* | 10/2005 | Kohyama ......... H04B 1/7093 375/232 |
| 2006/0285583 | A1 | 12/2006 | Baumgartner et al. |
| 2007/0025476 | A1 | 2/2007 | Rasmussen et al. |
| 2007/0280032 | A1 | 12/2007 | Kwak |
| 2008/0063128 | A1 | 3/2008 | Chatwin |
| 2008/0232443 | A1* | 9/2008 | Yu ............... H03C 3/0925 375/215 |
| 2009/0103675 | A1* | 4/2009 | Yousefi Moghaddam .......... H03L 7/0995 375/376 |
| 2009/0128204 | A1* | 5/2009 | Lim ............... H01Q 3/30 327/157 |
| 2009/0207961 | A1 | 8/2009 | Sai |
| 2009/0213973 | A1* | 8/2009 | Yanagidate ......... H03L 7/06 375/371 |
| 2010/0232481 | A1 | 9/2010 | Miyashita et al. |
| 2011/0010017 | A1 | 1/2011 | Jouper |
| 2011/0076944 | A1 | 3/2011 | Mihota et al. |
| 2011/0292990 | A1 | 12/2011 | Flynn et al. |
| 2012/0063549 | A1 | 3/2012 | Futami et al. |
| 2012/0218430 | A1* | 8/2012 | Yanagidate ....... H04N 21/2187 348/211.2 |
| 2012/0224657 | A1 | 9/2012 | Sasaki et al. |
| 2013/0007080 | A1 | 1/2013 | Liu et al. |
| 2013/0055006 | A1 | 2/2013 | Kossel et al. |
| 2013/0107987 | A1* | 5/2013 | Park ............... H03L 7/091 375/316 |
| 2013/0169329 | A1 | 7/2013 | Searles |
| 2013/0259178 | A1* | 10/2013 | Bae ............... H04L 7/007 375/376 |
| 2013/0284370 | A1* | 10/2013 | Collins ............. H05H 1/46 156/345.28 |
| 2014/0232598 | A1* | 8/2014 | Dai ............... H01Q 3/34 342/372 |

FOREIGN PATENT DOCUMENTS

| | | |
|---|---|---|
| JP | 56106162 | 8/1981 |
| JP | 61153576 | 7/1986 |

OTHER PUBLICATIONS

Chun et al., "Test of Phase Interpolators in High Speed I/Os Using Sliding Window Search", IEEE VLSI Test Symposium, 2012, Abstract, 1 page.

Kim, Hyunjin, "A Built-In Self-Test Scheme for DDR Memory Output Timing test and Measurement", IEEE VLSI Test Symposium, 2012, Abstract, 1 page.

Office Action from U.S. Appl. No. 15/816,425 dated Feb. 26, 2019; 16 pages.

Office Action in U.S. Appl. No. 15/816,425 dated Aug. 7, 2019, 22 pages.

* cited by examiner

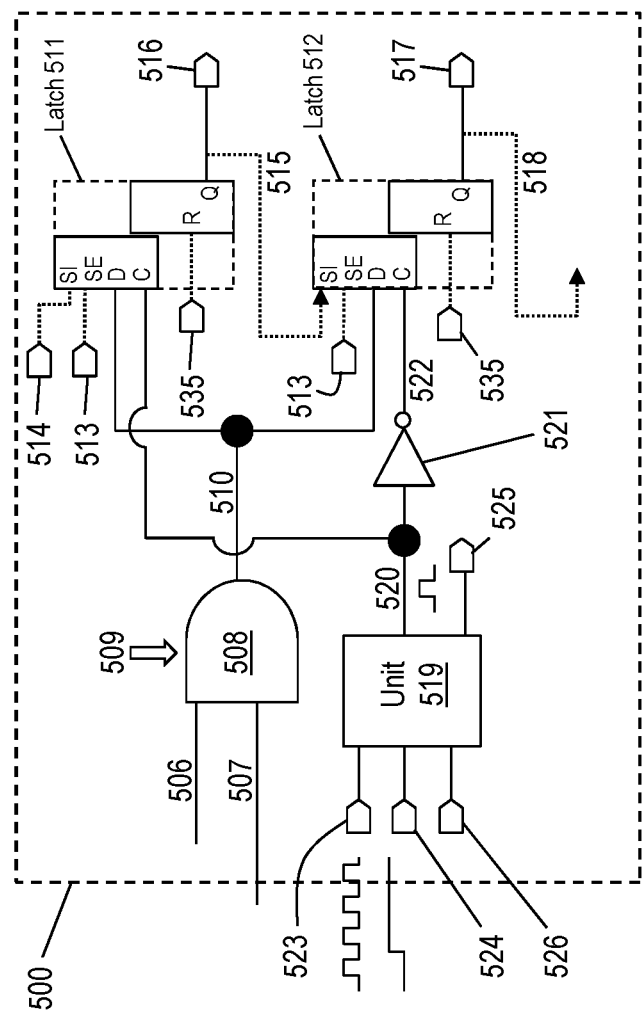
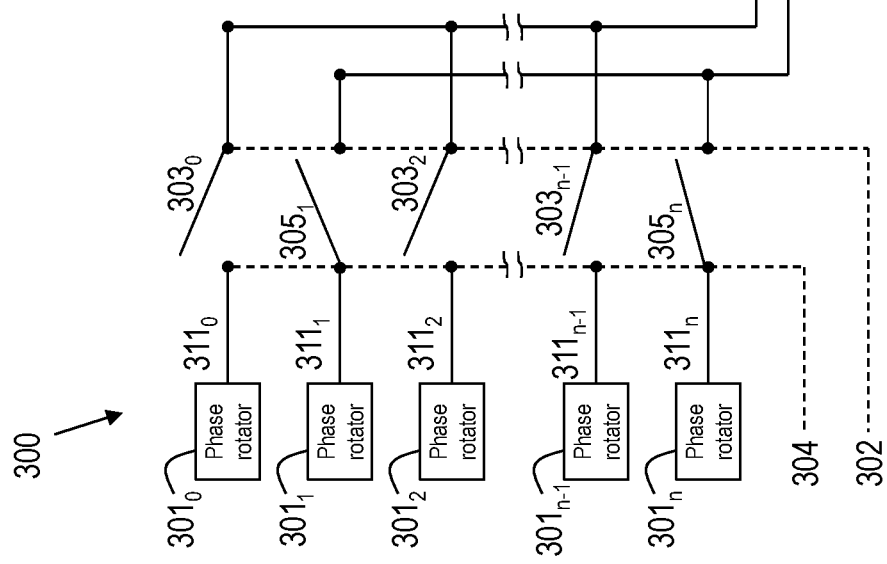
FIG. 5
FIG. 3

801 → Rotor Phase Selection

| Phase 1 Sel. | Phase 2 Sel. | Phase1 | Phase3 |
|---|---|---|---|
| 0 | 0 | 0 | 22.5 |
| 1 | 0 | 45 | 22.5 |
| 1 | 1 | 45 | 67.5 |
| 2 | 1 | 90 | 67.5 |
| 2 | 2 | 90 | 112.5 |
| 3 | 2 | 135 | 112.5 |
| 3 | 3 | 135 | 157.5 |
| 4 | 3 | 180 | 157.5 |
| 4 | 4 | 180 | 202.5 |
| 5 | 4 | 225 | 202.5 |
| 5 | 5 | 225 | 247.5 |
| 6 | 5 | 270 | 247.5 |
| 6 | 6 | 270 | 292.5 |
| 7 | 6 | 315 | 292.5 |
| 7 | 7 | 315 | 337.5 |
| 0 | 7 | 360 | 337.5 |

FIG. 8a

802 → Rotor Weighting Operation

| Weight | Phase 1 Sel. | Phase 2 Sel. | Phase1 | Phase2 | Degrees | Minor Ticks |
|---|---|---|---|---|---|---|
| 0 | 0 | 0 | 0 | 22.5 | 0 | 0 |
| 1 | 0 | 0 | 0 | 22.5 | 2.8125 | 1 |
| 2 | 0 | 0 | 0 | 22.5 | 5.625 | 2 |
| 3 | 0 | 0 | 0 | 22.5 | 8.4375 | 3 |
| 4 | 0 | 0 | 0 | 22.5 | 11.25 | 4 |
| 5 | 0 | 0 | 0 | 22.5 | 14.0625 | 5 |
| 6 | 0 | 0 | 0 | 22.5 | 16.875 | 6 |
| 7 | 0 | 0 | 0 | 22.5 | 19.6875 | 7 |
| 8 | 1 | 0 | 45 | 22.5 | 22.5 | 0 |
| 7 | 1 | 0 | 45 | 22.5 | 25.3125 | 1 |
| 6 | 1 | 0 | 45 | 22.5 | 28.125 | 2 |
| 5 | 1 | 0 | 45 | 22.5 | 30.9375 | 3 |
| 4 | 1 | 0 | 45 | 22.5 | 33.75 | 4 |
| 3 | 1 | 0 | 45 | 22.5 | 36.5625 | 5 |
| 2 | 1 | 0 | 45 | 22.5 | 39.375 | 6 |
| 1 | 1 | 0 | 45 | 22.5 | 42.1875 | 7 |
| 0 | 1 | 1 | 45 | 67.5 | 45 | 0 |

| Test Iteration | Test Steps | Test Increment Size 9 | | Full Rotate Address Space | | | | | |
|---|---|---|---|---|---|---|---|---|---|
| | | Step# | Weight | X1SEL | X2SEL | Phase1 | Phase2 | Degrees | Minor Ticks |
| Weight Coverage | | | | | | | | | |
| 0 | 0 | 0 | 0 | 0 | 0 | 0 | 22.5 | 0 | 0 |
| 1 | 9 | 9 | 7 | 1 | 0 | 45 | 22.5 | 25.3125 | 1 |
| 2 | 18 | 18 | 2 | 1 | 1 | 45 | 67.5 | 50.625 | 2 |
| 3 | 27 | 27 | 5 | 2 | 1 | 90 | 67.5 | 75.9375 | 3 |
| 4 | 36 | 36 | 4 | 2 | 2 | 90 | 112.5 | 101.25 | 4 |
| 5 | 45 | 45 | 3 | 3 | 2 | 135 | 112.5 | 126.5625 | 5 |
| 6 | 54 | 54 | 6 | 3 | 3 | 135 | 157.5 | 151.875 | 6 |
| 7 | 63 | 63 | 1 | 4 | 3 | 180 | 157.5 | 177.1875 | 7 |
| 8 | 72 | 72 | 8 | 5 | 4 | 225 | 202.5 | 202.5 | 8 |
| Root Phase Pair Coverage | | | | | | | | | |
| 0 — Covered in Weight Section | 0 | 0 | 0 | 0 | 0 | 0 | 22.5 | 0 | 0 |
| 1 — Covered in Weight Section | 8 | 8 | 8 | 1 | 0 | 45 | 22.5 | 22.5 | 0 |
| 2 — Covered in Weight Section | 16 | 16 | 0 | 1 | 1 | 45 | 67.5 | 45 | 0 |
| 3 — Covered in Weight Section | 24 | 24 | 8 | 2 | 1 | 90 | 67.5 | 67.5 | 0 |
| 4 — Covered in Weight Section | 32 | 32 | 0 | 2 | 2 | 90 | 112.5 | 90 | 0 |
| 5 — Covered in Weight Section | 40 | 40 | 8 | 3 | 2 | 135 | 112.5 | 112.5 | 0 |
| 6 — Covered in Weight Section | 48 | 48 | 0 | 3 | 3 | 135 | 157.5 | 135 | 0 |
| 7 — Covered in Weight Section | 56 | 56 | 8 | 4 | 3 | 180 | 157.5 | 157.5 | 0 |
| 8 — Covered in Weight Section | 64 | 64 | 0 | 4 | 4 | 180 | 202.5 | 180 | 0 |
| 9 | 72 | 72 | 8 | 5 | 4 | 225 | 202.5 | 202.5 | 0 |
| 10 — Covered in Weight Section | 80 | 80 | 0 | 5 | 5 | 225 | 247.5 | 225 | 0 |
| 11 | 88 | 88 | 8 | 6 | 5 | 270 | 247.5 | 247.5 | 0 |
| 12 | 96 | 96 | 0 | 6 | 6 | 270 | 292.5 | 270 | 0 |
| 13 | 104 | 104 | 8 | 7 | 6 | 315 | 292.5 | 292.5 | 0 |
| 14 | 112 | 112 | 0 | 7 | 7 | 315 | 337.5 | 315 | 0 |
| 15 | 120 | 120 | 8 | 0 | 7 | 360 | 337.5 | 337.5 | 0 |

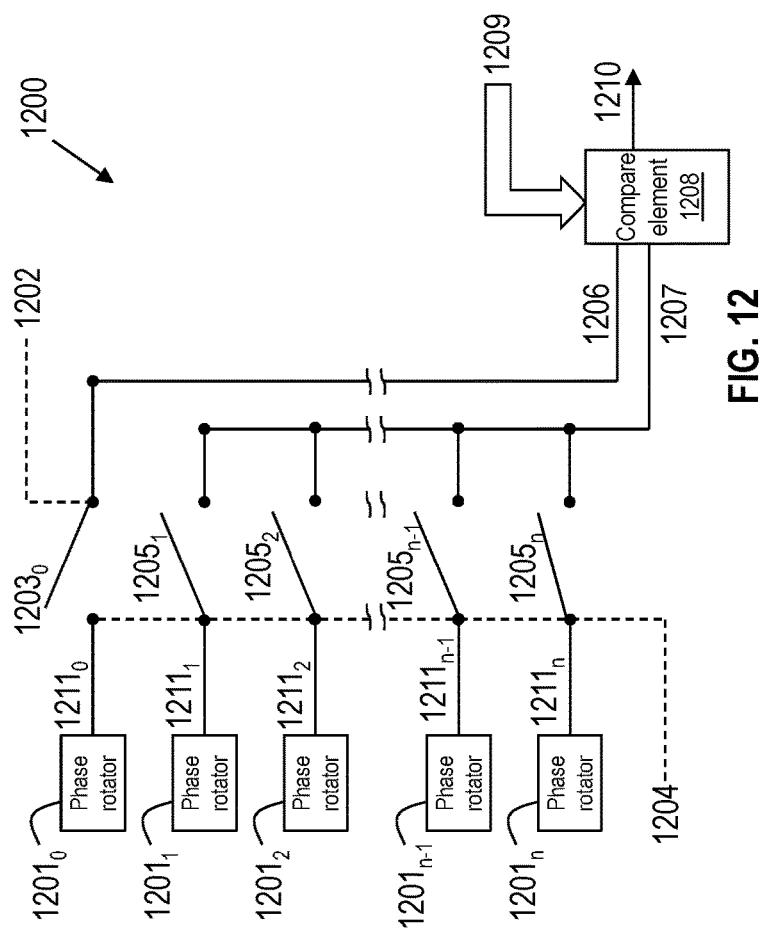
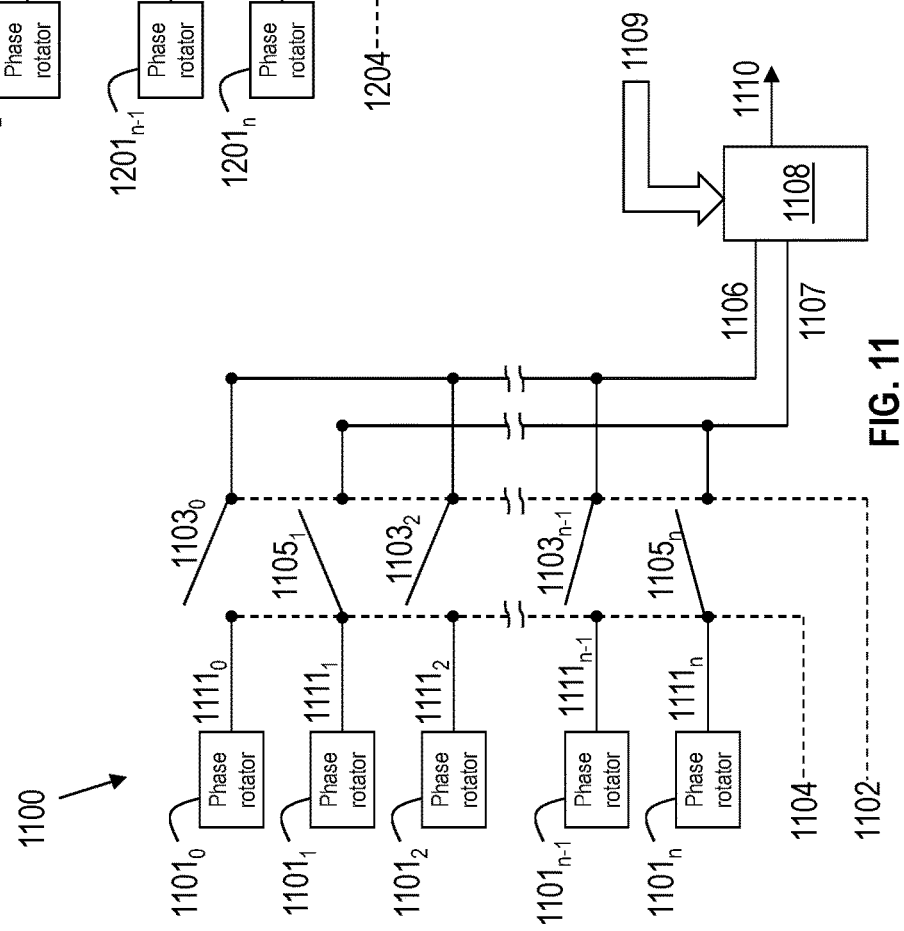

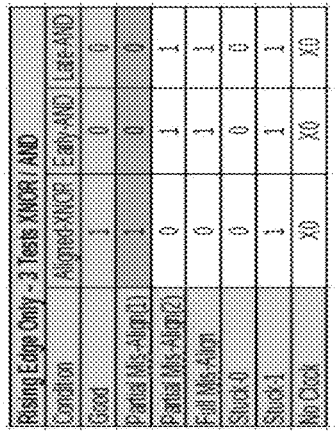
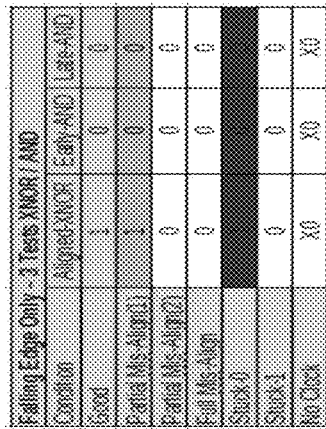
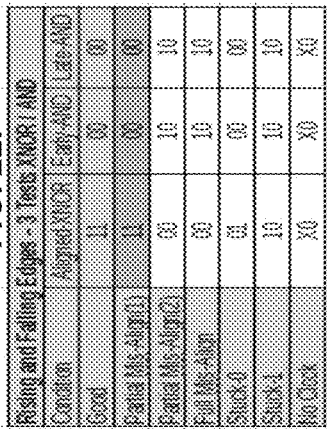
FIG. 22a  FIG. 22b  FIG. 22c
FIG. 22d  FIG. 22e  FIG. 22f
FIG. 22g  FIG. 22h  FIG. 22i
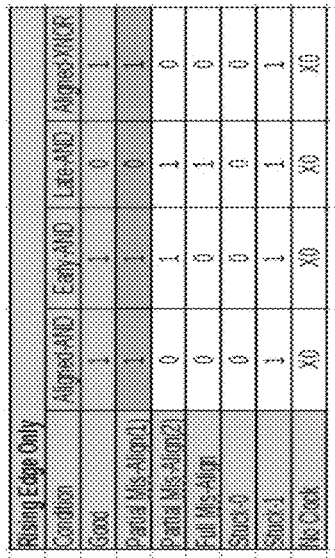
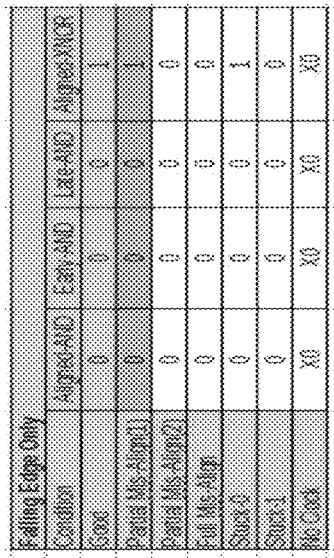
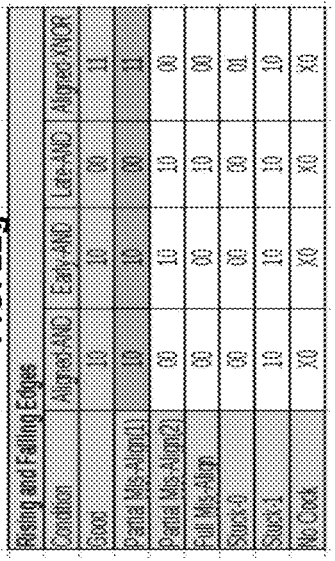

TESTING INTEGRATED CIRCUIT DESIGNS CONTAINING MULTIPLE PHASE ROTATORS

FIELD OF THE INVENTION

The invention relates to integrated circuit testing and, more particularly, to testing phase rotators.

BACKGROUND

High speed links employ sophisticated analog circuits and logic in order to achieve performance targets and in many cases utilize a plurality of calibrated local clocks in order to transfer data while maximizing data transmit and capture margins. Phase rotator circuits are commonly used to produce the plurality of local clocks. Phase rotators act as clock phase mixers and provide a mechanism of creating, manipulating, and calibrating tightly timed clock edges from a much smaller set of high accuracy root phases. For example, a phase rotator may be designed to provide 128 output phases using just 16 selectable input phases. Further, the compact nature of the phase rotator structure allows for a plurality of phase rotators to be placed within the high speed link. For example, a DDR data link may be implemented with separate Rx (read) and Tx (write) clock phase rotators for each data bit/lane, and provided with additional phase rotators for digital synchronization and calibration.

Manufacturing defects have the potential to totally disable a phase rotator and, as such, it is common to test for such defects. However, it can be very difficult to ensure no manufacturing defects exist in a phase rotator design. A manufacturing tester normally does not have fine enough resolution to discern whether a phase rotator is properly operating at its functional speed since the manufacturing tester typically operates at a slower speed than the phase rotator operates. Also, some manufacturing testers do not have fine enough granularity to discern the individual step increments of a phase rotator. As a result, the quality of the manufacturing test is reduced to match the quality of the manufacturing tester or test-only logic is inserted into the design. This is counterproductive since reducing the quality of the manufacturing test may lead to defective parts being released from the manufacturer, and inserting test-only logic onto the design increases area and power demands.

SUMMARY

In a first aspect of the invention, there is a circuit for testing phase rotators. The circuit includes a compare element including a first input and a second input, wherein the compare element is configured to compare a first phase of a first signal provided at the first input to a second phase of a second signal provided at the second input. The circuit also includes a first test bus connected to the first input and a second test bus connected to the second input.

In another aspect of the invention, there is a system for testing phase rotators. The system includes a first test bus connected to a first input of a compare element and a second test bus connected to a second input of the compare element. The system also includes a control circuit configured to: selectively connect a first phase source to the first test bus; selectively connect a second phase source comprising an output of one of a plurality of phase rotators to the second test bus; store an output of the compare element; and provide inputs to the plurality of phase rotators.

In another aspect of the invention, a method of testing phase rotators includes connecting a first phase source to a first input of a compare element. The method also includes connecting a second phase source to a second input of a compare element, wherein the second phase source comprises an output of one a plurality of phase rotators that are selectively connectable to the second input. The method additionally includes generating an expected value of a phase relationship between the first phase source and the second phase source. The method further includes comparing the expected value to an output of the compare element.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a circuit for testing phase rotators which comprises the structures of the present invention. In still further embodiments, a method in a computer-aided design system is provided for generating a functional design model of a circuit for testing phase rotators. The method comprises generating a functional representation of the structural elements of the circuit for testing phase rotators.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIG. 3 shows a phase rotator test structure in accordance with aspects of the invention;

FIG. 5 shows a phase rotator test structure in accordance with aspects of the invention;

FIGS. 8a-c show exemplary phase pairs and outputs in accordance with aspects of the invention;

FIGS. 9-12 show phase rotator test structures in accordance with aspects of the invention;

FIGS. 22a-i show truth tables based on the pattern sets of FIG. 21 in accordance with aspects of the invention;

DETAILED DESCRIPTION

Figure 1A:
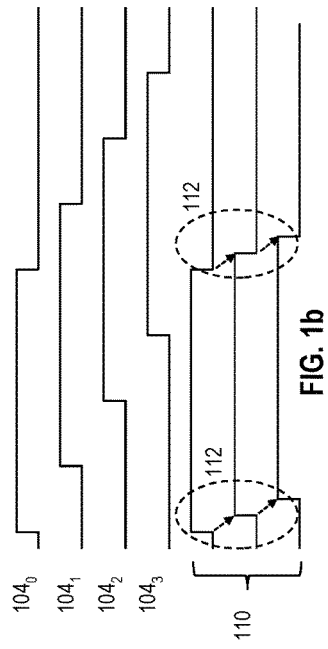
FIG. 1a shows a phase rotator and FIG. 1b shows waveforms associated with the phase rotator.

The invention relates to integrated circuit testing and, more particularly, to testing phase rotators. According to aspects of the invention, there is a high speed I/O design which tests two or more phase rotators in parallel, testing one phase rotator against another. Implementations of the invention may be used to fully verify the phase rotators are defect free. In embodiments, the testing scheme utilizes a tunable AND gate, without the need use additional gates and extra test-only phase rotators.

In a particular exemplary embodiment, half of the phase rotators of a high speed I/O feed one side of a tunable AND circuit, and the other half of the phase rotators feed the other side of the tunable AND circuit. In aspects, the tunable AND circuit is provided with controls that allow a user (e.g., a test engineer) to add a finite amount of delay to either input and to control the minimum pulse width to consider. Such controls may be used in diagnosing any defects that are found during testing. In this exemplary embodiment, a typical manufacturing test would run the following three tests: (1) Phase Rotator A and Phase Rotator B are in phase and both phase rotators are simultaneously rotated through their design range, in which case the output of the tunable AND circuit should always be a logical one to pass the test; (2) Phase Rotator A is 180 degrees ahead of Phase Rotator B and both phase rotators are simultaneously rotated through their design range, in which case the output of the tunable AND circuit should always be a logical zero to pass the test; (3) Phase Rotator B is 180 degrees ahead of Phase Rotator A and both phase rotators are simultaneously rotated through their design range, in which case the output of the tunable AND circuit should always be a logical zero to pass the test.

Implementations of the invention may be driven by a Built-In Self Test (BIST) finite state machine that is configured to cycle through all phase rotators enabling and testing two phase rotators at a time. In aspects, the BIST finite state machine is configured to run through tests (1)-(3) on the enabled pair of phase rotators, then disable those two phase rotators and enable the next pair for the same testing. In embodiments, a result latch is used to store an indication of whether any defects are found.

In a first aspect of the invention, there is a structure for providing a test of a plurality of phase rotators in an integrated circuit. The structure includes a phase comparison element including a first and second phase input and an output which is a function of the phase relationship between the first and second phases. The structure also includes a first phase clock source that is connectible to the first phase input. The structure additionally includes a plurality of phase rotators, each of the phase rotators selectively connectible to the second phase input. The structure further includes logic for cycling through each of the plurality of phase rotators as well as cycling through a set of input parameters for each phase rotator and sampling the output of said phase comparison means at each iteration.

In another aspect of the invention, there is a method of providing a test of a plurality of phase rotators in an integrated circuit. The method includes: selecting a first phase source as a first input to a phase comparator circuit; selecting a first phase for the first phase source; selecting a second phase source as second input to a phase comparator circuit; and selecting a second phase for the second phase source. The method also includes generating a phase compare expect for the first and second sources based on the first and second phases selected and testing the expect value against the output of the comparator circuit. The method additionally includes iterating through a plurality of first and second phases.

Phase rotators are usable to construct an output signal having a phase that is related to the phase of one or more input signals in some desirable way. Phase rotators are often used in serial data transmission and receiving circuitry as a component for aligning a sampling clock to recover serial data. Phase rotators typically generate an output signal having a phase with a known relationship to the serial data. The output signal is typically generated from a mix of incoming signals having defined offset phase relationships (commonly referred to as phasors).

Referring to FIG. 1a, a phase rotator 100 is shown. Two phase selection units 101 and 102 provide selection of incoming phases 104. Unit 101 selects one of even incoming phases $104_0$, $104_2$, etc., as provided by control selection signal(s) 105, and unit 102 selects one of odd incoming phases $104_1$, $104_3$, etc. as provided by control selection signal(s) 106. The output phases 107 and 108 of units 101 and 102 are provided to a phase mixer 103 which weights the incoming phases 107 and 108 in accordance with a control signal 109 to form a composite phase output 110. Phase output 110 may be related only to the phase of 107, only to the phase of 108, or may be a phase incrementally spaced between 107 and 108.

Figure 1B:
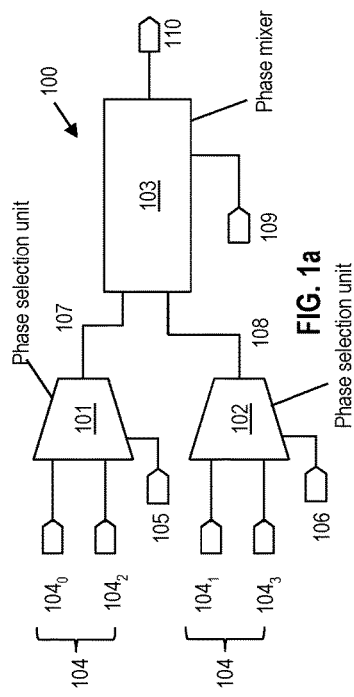

Referring to FIG. 1b, representative waveforms for the phase rotator of FIG. 1a are shown. Waveforms $104_0$, $104_1$, $104_2$, and $104_3$, illustrate four incoming phases separated by 90°. Waveform 110 illustrates the case where selection signal 105 selects $104_0$, selection signal 106 selects $104_1$, and control signal 109 is incremented. As selection signal 109 is incremented, the waveform 110 (i.e., phase output) shifts to the right as shown in regions 112. Both the rising and falling edges of the phase output 110 shift. The number of incoming phases 104 and weighting increments as controlled by control signal 109 is variable. For instance, the number of incoming phases may be 16 and the number of weighting steps may be 8, providing 128 unique variations of output phase 110.

Figure 2:
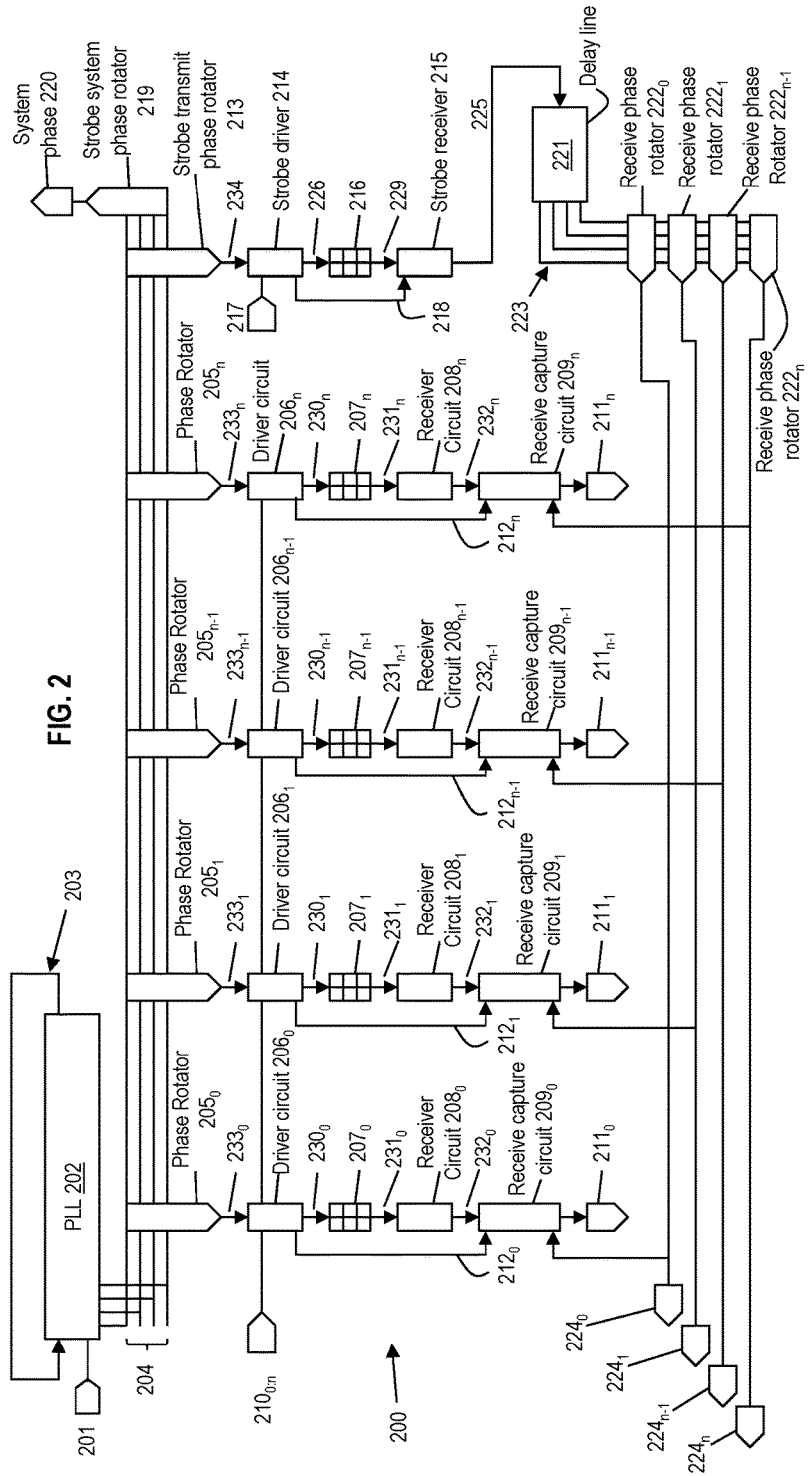
FIG. 2 shows an analog domain within a high speed link.

FIG. 2 illustrates an example of an analog domain within a high speed link. Analog link 200 contains a reference clock input 201, phase lock loop (PLL) 202, and a PLL feedback connection 203. PLL 202 creates multiple phases 204 which are provided to a plurality of data transmit phase rotators $205_{0:n}$ that create data transmit clock phases $233_{0:n}$. The phases 204 are also provided to a strobe transmit phase rotator 213 that creates strobe transmit phase 234. The phases 204 are also provided to system phase rotator 219 that create one or more system or link phases 220. Analog link 200 further contains driver circuits $206_{0:n}$ that use transmit clock phases $233_{0:n}$ to capture transmit data $210_{0:n}$ from the digital portion of the link and drive the data signals to off-chip pads $207_{0:n}$ via connections $2300_{0:n}$. Likewise, phase rotator 213 provides its generated clock 234 to driver circuit 214 which captures strobe data 217 from the digital portion of the link and drives the strobe signal(s) off-chip via connection 226 to pad 216. Phase rotator 219 and phase rotated clock 220 may serve multiple purposes including conditioning the launch of transmit data $210_{0:n}$ and strobe data 217 at the optimal time for capture by rotated clock phases $233_{0:n}$ and 234. Off-chip pads $207_{0:n}$ are also connected to receiver circuits $208_{0:n}$ via connectors $231_{0:n}$. Connections $232_{0:n}$ connect outputs of receiver circuits $208_{0:n}$ to receive capture circuits $209_{0:n}$.

For test, a bypass connection $212_{0:n}$ may be provided between the driver circuits $206_{0:n}$ and the receive capture circuits $209_{0:n}$ to allow for operation of the link in a "loopback" mode. Similar to the data path, off-chip pad 216 also connects to a strobe receiver 215 via connection 229, and a bypass connection 218 between the strobe driver 214 and the strobe receiver 215 may be provided for test. Strobe receiver 215 provides a strobe signal to delay line 221 via connection 225. In-turn, delay line 221 provides multiple strobe phases 223 to receive phase rotators $222_{0:n}$. The phase rotators $222_{0:n}$ are used to generate read phase clocks $224_{0:n}$ that are used by receive capture circuits $209_{0:n}$ for latching data provided by the data receivers $208_{0:n}$. The read phase clocks $224_{0:n}$ are also provided to the digital portion of the link for timing of receive capture circuits $209_{0:n}$ outputs $211_{0:n}$ across the analog-digital boundary.

In order to test analog link 200 in a manufacturing mode, a reference clock frequency is provided at 201, a known data pattern is provided at $210_{0:n}$, and a strobe pattern is provided at 217. Each of the phase rotators $205_{0:n}$, 213, and 219 are set to provide transmit clock phases $233_{0:n}$ and 234 as well as system clock phase 220. Connections $212_{0:n}$ are selected for input to receive capture unit $209_{0:n}$ and connection 218 is selected for input into strobe receiver 215, placing the link in a loopback test mode. Strobe receiver 215 provides a test version of the strobe signal to delay line 221 which generates strobe phases 223. Given a correct setting for read clock phase rotators $222_{0:n}$, clocks $224_{0:n}$ will successfully latch data on bypass connections $212_{0:n}$ and provide the result on outputs $211_{0:n}$ which can be checked for matching against the original data $210_{0:n}$ within the digital domain. The test as described verifies the general function of the PLL, phase rotators, transmit, receive and delay line unit, however the test is not exhaustive. As each phase rotator provides the capability for a multitude of output phases given a plurality of input phases and weighting options, and capture of correct data is a windowed event, the full connectivity and functionality of the phase rotator is not guaranteed; yet, the functional operation of the link depends on phase rotator operation. This test methodology does not isolate the phase rotators from other portions of the link.

FIG. 3 shows a phase rotator test structure 300 in accordance with aspects of the invention. In embodiments, the phase rotator test structure 300 is comprised of a plurality of phase rotators $301_{0:n}$ similar in construction to the phase rotator described in FIG. 1a. Each phase rotator $301_{0:n}$ provides an output phase $311_{0:n}$ which is used in the functional mode of the link or other function. A subset of output phases $311_0, 311_2, \ldots 311_n$ are selectively connected to first test bus 306 via switches $303_{1:n}$ (e.g., incremented by 2) which are controlled by selection signal 302. The remaining output phases $311_1, \ldots 311_n$ are selectively connected to a separate, second test bus 307 via switches $305_{1:n}$ (e.g., incremented by 2) which are controlled by selection signal 304. Thus, in this example, a first half of the plurality of phase rotators $301_{0:n}$ may be selectively connected to first test bus 306, and a second half of the plurality of phase rotators $301_{0:n}$ may be selectively connected to second test bus 307. The number of phase rotators connectible to (e.g., associated with) each test bus 306 and 307 need not be equivalent.

In aspects, select signals 302 and 304 are used and configured to select one phase rotator at a time for connection to each of the test buses 306 and 307 during manufacturing testing. Additionally, select signals 302 and 304 are used and configured to isolate all phase rotators from test buses 306 and 307, in which case the select signals 302 and 304 may be used to stabilize the test buses 306 and 307. In embodiments, test buses 306 and 307 are provided as inputs to logic 308 which is configured to test the phase arrival of a signal on the first test bus 306 versus the phase arrival of a signal on the second test bus 307. In this manner, logic 308 is a compare element that is configured to compare a first phase of a first signal provided at the first input to a second phase of a second signal provided at the second input.

Control signal 309 is configured to provide control to logic 308. This control may include, for example, timing control, minimum pulse width control or dead-band control, or other control as needed to finely tune the logic function and phase testing. The output of logic 308 is provided at output 310 for monitoring during test application. Structure 300 allows for the output phase of a first selected one of phase rotators $301_{0:n}$ to be compared against the phase of a second selected one of phase rotators $301_{0:n}$ with logic to ascertain the phase relationship between the two selected phase rotators. Using this structure, an ordered approach to phase rotator selection, phase selection for each phase rotator, and weighting selection for each phase rotator may be used to test the plurality of phase rotators $301_{0:n}$ in isolation from other transmit and receive circuits.

Figure 4:
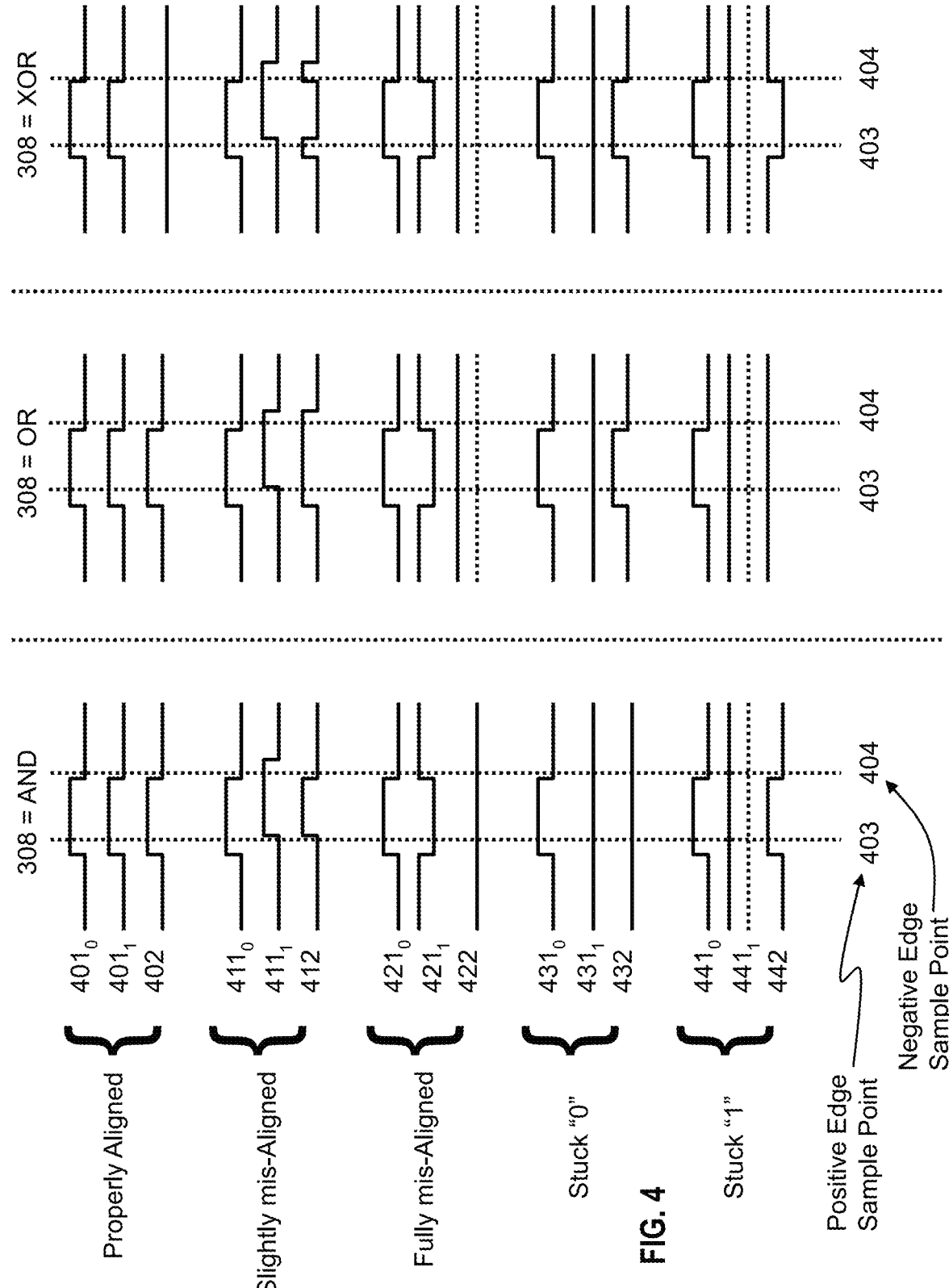
FIG. 4 shows exemplary logic functions for a phase rotator test structure in accordance with aspects of the invention.

FIG. 4 illustrates a number of logic functions for logic 308 of FIG. 3 according to aspects of the invention. The logic functions shown in FIG. 4 are exemplary and non-limiting, and other logic functions, or combinations of logic functions, may be used within the scope of the invention. As shown in FIG. 4, signals $401_0, 411_0, 421_0, 431_0$ and $441_0$ represent the phase of a phase rotator (e.g., a first one of phase rotators $301_{0:n}$) selected onto a first test bus (e.g., test bust 306), and signals $401_1, 411_1, 421_1, 431_1$ and $441_1$ represent the phase of a phase rotator (e.g., a second one of phase rotators $301_{0:n}$) selected onto a second test bus (e.g., test bust 307). Signals 402, 412, 422, 432 and 442 depict the result of the specified logic function at logic 308 (e.g., AND, OR, XOR) when the phase rotators on the first and second test buses are aligned ($401_0, 401_1, 402$), slightly miss-aligned ($411_0, 411_1, 412$), fully miss-aligned ($421_0, 421_1, 422$), when the second test bus is stuck-0 ($431_0, 431_1, 432$), and when the second test bus is stuck-1 ($441_0, 441_1, 442$). Timing markers 403 and 404 within FIG. 4 provide sampling points related to the first test bus clock edges which may be created via a delay. Marker 403 represents a sample point related to the rising/positive edge on the first test bus, and marker 404 represents a sample point related to the falling/negative edge of the first test bus. Depending on the phase selection and weighting patterns selected for test, and the desirability of testing for either positive edge arrival only or positive edge and duty cycle of the pulses, one or more logic functions may be required.

FIG. 5 depicts additional structure that may be used with the test structure 300 of FIG. 3 in accordance with aspects of the invention. Test bus 506, test bus 507, and logic 508 of FIG. 5 correspond respectively to test bus 306, test bus 307, and logic 308 of FIG. 3. Block 500 contains first test bus 506 and second test bus 507 which are inputs to logic 508. Logic 508 is tunable via input 509 and provides phase comparison output 510, which may be a single signal or multiple signals. In embodiments, signal 510 is provided as the data input at a data (D) port of two latches 511 and 512. Each latch 511 and 512 is illustrated as a scannable latch as part of a scannable test methodology, but may alternatively be non-scannable and queried through an alternate mechanism. Input 514 to latch 511 is the scan-in (SI) port while input 513 to both latches 511 and 512 is the scan enable (SE) port. Both latches 511 and 512 have a reset (R) port driven from signal 535 for initialization. The output 516 from the first latch 511 may be connected to the scan-in port of the second latch 512 via connection 515. Likewise, the output 517 of the second latch 512 may be connected to the scan-in port of a further latch via connection 518.

Still referring to FIG. 5, unit 519 provides a one-shot sampling phase in a test mode on signal 520 which is inverted by inverter 521 to create an inverted one shot sampler 522. Using sample clocks 520 and 522, which provide the clock to latches 511 and 512 at clock ports (C), respectively, the rising and falling edge logic response from logic 508 is sampled. Unit 519 uses a clock input 523 which may be connected to one of test bus 506 or test bus 507, and one-shot enable 524 in order to trigger the sampling clock. Unit 519 may also have additional control 526 to provide requisite clocking in a non-sample mode, such as for scan. Unit 519 may further provide additional outputs 525.

Figure 6:
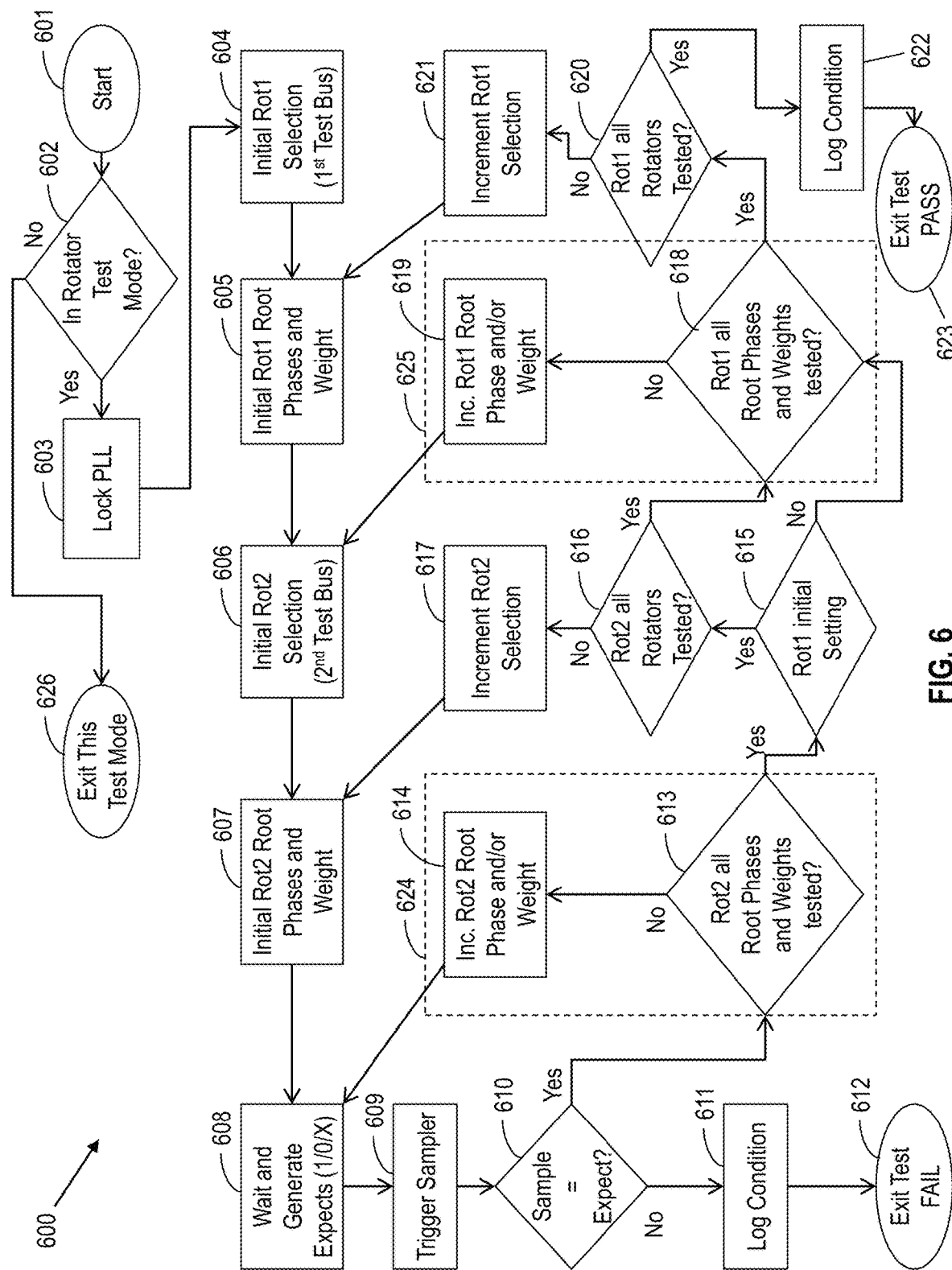
FIGS. 6 and 7 show flows of processes in accordance with aspects of the invention.

FIG. 6 shows a flow 600 of a process in accordance with aspects of the invention. In particular, the flow 600 is a test flow that may be used with the test structures 300 and 500 of FIGS. 3 and 5 and certain ones of the steps of the flow are described with respect to reference numbers used in FIGS. 3 and 5. Functionality and/or steps described in the flow 600, and other flows in other figures described herein, may be driven and/or controlled using control logic such as a BIST finite state machine as described herein or other suitable control logic.

The flow 600 starts at step 601. At step 602, it is determined whether or not the phase rotator test mode is active. If the phase rotator test mode is not active, then the process exits to step 626. If the phase rotator test mode has been selected, then at step 603 a phase locked loop (PLL) which provides the clock phases to the phase rotators is locked. In an alternate embodiment, step 603 may include a provision to source the clock into a delay line as opposed to a PLL.

Once the PLL is locked at step 603, at step 604 a selection is made of a first phase rotator (Rot1) from a first plurality of phase rotators (e.g., phase rotators $301_{0:n}$) capable of being connected to the first test bus (e.g., test bus 306 of FIG. 3). At step 605, input phase selection and weighting for the first phase rotator is set to an initial test state. At step 606, a selection is made of a second phase rotator (Rot2) from a second plurality of phase rotators (e.g., phase rotators $301_{0:n}$) capable of being connected to the second test bus (e.g., 307 of FIG. 3). At step 607, the second phase rotator has its input phase and weighting set to an initial test state that may or may not be equivalent to the setting for the first phase rotator. With both phase rotators Rot1 and Rot2 set, the process moves to step 608 where the test sequence waits for the phase rotators to phase-stabilize and for comparison expects for the given combination of phases and weights programmed into the two phase rotators to be calculated.

With continued reference to FIG. 6, when the wait time at step 608 is satisfied, the process progresses to step 609 where a sample of the logic output is taken and then to step 610 where the sampled result is compared against the generated expect (also called an expect value). In the event the sampled result does not conform to the expect, this indicates that the test has failed, at which point the failure condition is logged at step 611 and the test exits with failure at step 612. Alternatively, if the sampled result is in accordance with the expected result at step 610, then the process continues to step 613 where it is determined if all desired phase and weight combinations for the second phase rotator have been tested. This set of phases and weights may be a full binary combination of all valid possibilities, or some subset which tests connectivity of the phase rotator. If all combinations of interest have not been tested, the process moves to step 614 where the second phase rotator is updated for the next phase and weight combination and the process returns to step 608. The loop through steps 608, 609, 610, 613 and 614 continues until all phase and weight combinations of interest of the second phase rotator are tested.

Still referring to FIG. 6, when it is determined at step 613 that all desired phase and weight combinations for the second phase rotator have been tested, the process moves to step 615 where it is determined if testing is still progressing with the first phase rotator of the plurality of phase rotators connectible to the first test bus selected. In embodiments, step 615 is an optimization that allows for all "second phase rotators" to be cycled through for only a first "first phase rotator" selection in order to save test time. Step 615 is optional, and if it is removed, step 613 would exit to step 616 instead of 615. As shown in method 600, if it is determined at step 615 that the first phase rotator is still at its initial setting, the process moves to step 616 to determine whether all "second phase rotators" in the plurality of phase rotators connected to the second test bus have been tested. If all "second phase rotators" have not been tested, then the process moves to 617 where the "second phase rotator" under test is incremented and the process returns to step 607. This loop through steps 607, 608, 609, 610, 613, 615, 616 and 617 may continue until all phase rotators in the second plurality are tested.

When it is determined at step 616 that all phase rotators in the second plurality have been tested, the flow proceeds to step 618 where it is determined whether all desired phases and weights for the phase rotator selected from the first plurality and connected to the first test bus have been tested. When step 618 is false or negative, the process continues to step 619 where the phase rotator selected from the first plurality is updated to the next desired phase and weight combination and the process returns to step 606. The loop continue through steps 606, 607, 608, 609, 610, 613, 614, 615, 616, 617, 618 and 619 until all desired phase rotator settings for the selected phase rotator from the first plurality have been tested against all desired phase and weight combinations for all of the second plurality phase rotators.

When it is determined at step 618 that all desired phases and weights for the phase rotator selected from the first plurality and connected to the first test bus have been tested, the process advances to step 620 to determine whether all phase rotators from the first plurality have been tested. When step 620 is false or negative, then at step 621 the next phase rotator in the first plurality is selected for connection to the first test bus and the process returns to step 605, with continued looping. When method 600 includes step 615, only a single phase rotator from the second plurality of phase rotators is tested against each of the succeeding phase rotators selected from the first plurality of phase rotators. When step 615 is omitted from method 600, each phase rotator from the second plurality is tested against each phase rotator from the first plurality of phase rotators. When step 620 is false or negative, i.e., it is determined that all phase rotators from the first plurality have been tested, the phase rotator test is indicated as being successful. The result is logged at step 622 and the phase rotator test exits with a pass at step 623.

In a particular embodiment of flow 600, the increment of the first and second plurality of phase rotators is constrained such that the first phase rotator in the first plurality of phase rotators is only tested against the first phase rotator in the second plurality of phase rotators; the second phase rotator in the first plurality of phase rotators is only tested against the second phase rotator in the second plurality of phase rotators; the third phase rotator in the first plurality of phase rotators is only tested against the third phase rotator in the second plurality of phase rotators and so forth until all phase rotators are tested.

The number of phase and weight combinations over which a phase rotator may be tested is quite large. For example, a phase rotator may be used to create 128 different output phases given different combinations of phase selection and weighting parameters. While testing all combinations of phase rotator phase and weight selection may be exhaustive, connectivity and functionality verification may be accomplished with a much smaller set of patterns which target phase selection and weight individually to insure that each phase selection and each weight selection is tested at least once in the pattern set. In order to optimize pattern selection, steps 613 and 614 included in step subgroup 624 and similarly setups 618 and 619 included in step subgroup 625 may be expanded into the flow shown in FIG. 7.

Figure 7:
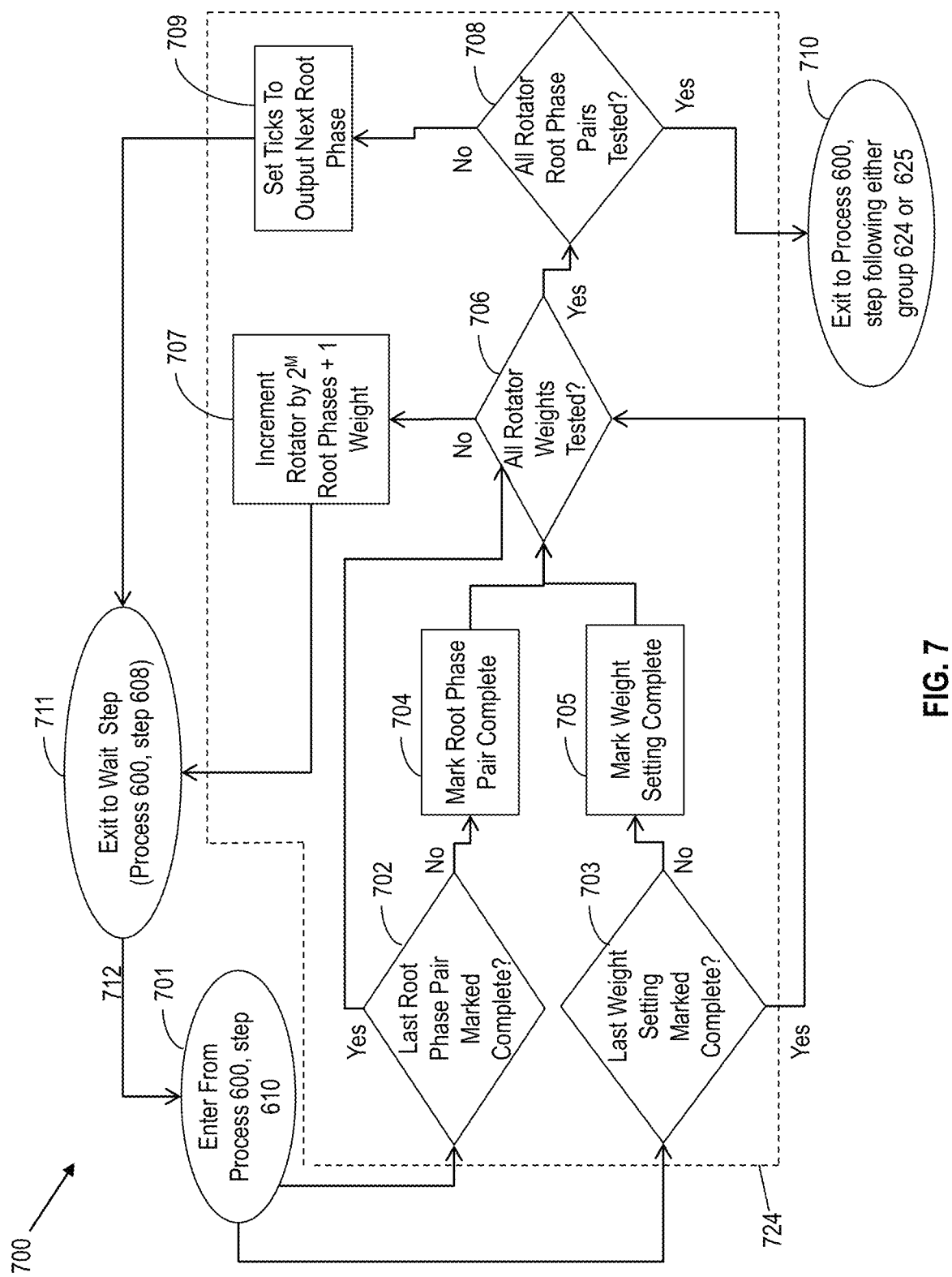

FIG. 7 shows a method flow 700 in accordance with aspects of the invention. Group 724 of FIG. 7 shows an exemplary implementation of the steps of groups 624 and 625 of FIG. 6. Group 724 begins at step 701 where the results of the previous sample were found to match their expect values. Steps 702 and 703 of group 724 represent determining whether the phase selection and weight selection components of the phase rotator setting from step 701 had previously been tested. This is performed since the phase output of the phase rotator is a combination of both parameters, such that testing the phase rotator fully may involve testing at least one of the phase or weight more than once. When the phase and/or weight of the passing combination has not been tested previously, they are marked off as complete at steps 704 and 705 respectively and the process moves to step 706. Alternatively, if the phase and or weight has been tested previously, mark-off is not performed and the process moves directly to step 706.

At step 706, it is determined whether all valid weights have been tested. If all valid weights have not been tested, the process moves to step 707 where the phase rotator is updated by a non-binary number of steps, e.g., 5, 9, 17, 33, etc. This by definition will advance both the phase selection and weight selection of the phase rotator. After step 707, the process 700 exits at step 711 which corresponds to step 608 forward of process flow 600 of FIG. 6. On successful test compare the larger process 600 would move to step 701 (via path 712) with successful compare at step 610. This loop would continue until all valid weights were tested. For example, for a phase rotator with eight unique weight settings, the process may flow through step 707 seven times.

Still referring to FIG. 7, when the result of step 706 indicates that all weights have been tested, the process moves to step 708 where it is determined if all valid phase pair selections for the phase rotator are covered. If coverage is incomplete, the process moves to 709, the phase rotator is updated to cover the next untested phase pair at any weight combination and the process returns to step 711. For a phase rotator with 16 valid phase pair selections, process 700 will move through step 709 fewer than 15 times as some of the phase-pairs were tested in the inner loop through step 707. Once all phase pairs have been tested, process 700 exits through step 710 to either the step following process 600 group 624 for the "second phase rotator" or the step following process 600 group 625 for the "first phase rotator". The steps of flow 700 may be implemented at least partly as logic, as firmware, or as a pre-defined table of phase pairs and weight combinations to be tested.

FIGS. 8a, 8b, and 8c show an example that illustrates process 700 of FIG. 7 in accordance with aspects of the invention. FIG. 8a shows valid phase pairs 801 for a phase rotator capable of generating 128 output phases using 16 incoming phases and 8 weight settings. As illustrated in FIG. 8a, there are 16 valid combinations of input phase pairs which are tested in order to insure that all phases are physically connected to the phase rotator circuit and that the selection circuitry is functioning as expected.

FIG. 8b shows a table 802 illustrating the effect of the weighting parameter on output phase over two consecutive phase pairs. This example is not intended to be limiting, and other combinations of phase pair counts, weighting counts and decodes may be used while not departing from the scope of the invention.

FIG. 8c shows a condensed set 803 of phase pair and weight combinations cycled through during phase rotator test as calculated for non-$2^n$ increment value of nine. This example is not intended to be limiting, other increment values are possible, and different increment values will provide differing numbers of patterns. For the example of FIG. 8c, nine iterations (zero through eight) of phase-pair and weight are used to fully test the weighting functionality. Because testing of the weights also tests nine phase-pair combinations, only seven additional phase-pair/weight combinations are used to test the remaining phase pairs. As a result, only sixteen combinations are used to test connectivity of the phase rotator versus 128 for the fully exhaustive case. In addition, the increment by nine separates the phases in any two consecutive test vectors significantly, removing measurement differentiation uncertainty. Using the above method with a different increment value, incrementing by 33 would use 20 patterns and incrementing by 5 would use 19 patterns, both of which are larger than the increment-by-9 value due to smaller coverage of phase-pairs during weight testing.

Figure 9:
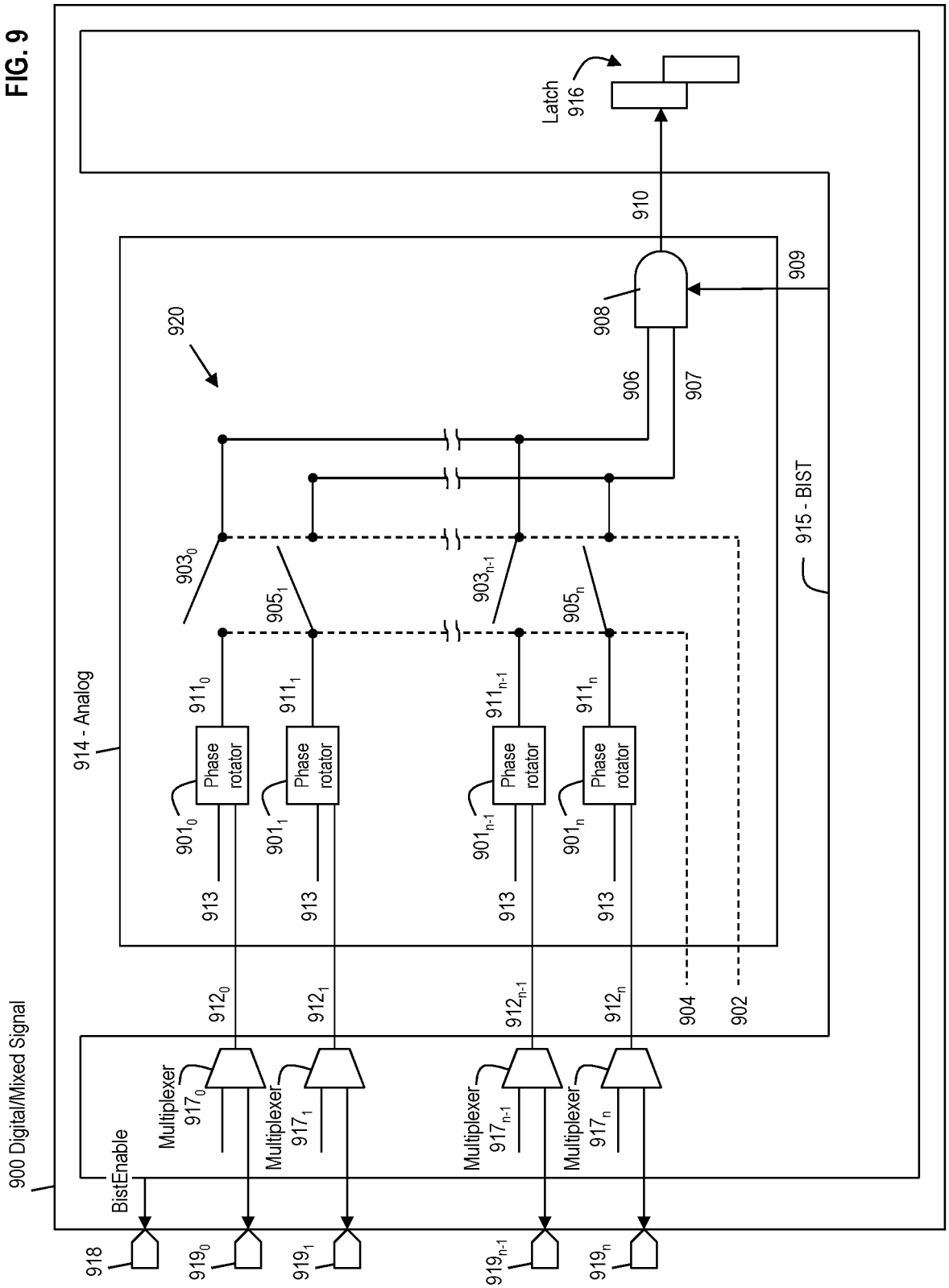

FIG. 9 shows a test structure 900 in accordance with aspects of the invention. In particular, FIG. 9 illustrates elements of structures 300 and 500 of FIGS. 3 and 5 embedded within a larger mixed-signal structure 900. In embodiments, a built-in-self-test (BIST) 915 is included in structure 900 and forms a wrapper around analog sub-unit 914 which contains structure 920. In aspects, structure 920 contains phase rotators $901_{0:n}$, first and second test buses 906 and 907, selection switches 903 and 905, logic 908 and logic output 910, which may be similar to those elements described in structure 300 of FIG. 3. Latch 916 within the BIST 915 may be similar to latch 511 or 512 of FIG. 5.

In aspects, BIST 915 supplies control and/or tuning signals 909 to the test logic 908 as well as phase rotator phase and weight selection signals $912_{0:n}$ to each of the phase rotators $901_{0:n}$. In embodiments, BIST 915 also supplies select controls 902 and 904 which select phase rotator outputs onto the first test bus 906 and second test bus 907. BIST 915 may contain multiplexers $917_{0:n}$ that select between functional mode phase and weight settings $919_{0:n}$ and test mode phase and weight settings generated within the BIST 915. BIST 915 may also have a BistEnable input 918 for selecting phase rotator test, e.g., test mode. Rotator phase inputs 913 are common to all phase rotators 901$_{0:n}$ being tested, are dependent on phase rotator type, and may be sourced from a multi-phase PLL or delay line within analog unit 914. The structure 900 allows testing of phase rotators 901$_{0:n}$ with very little external overhead and/or complexity of the tester.

Figure 10:
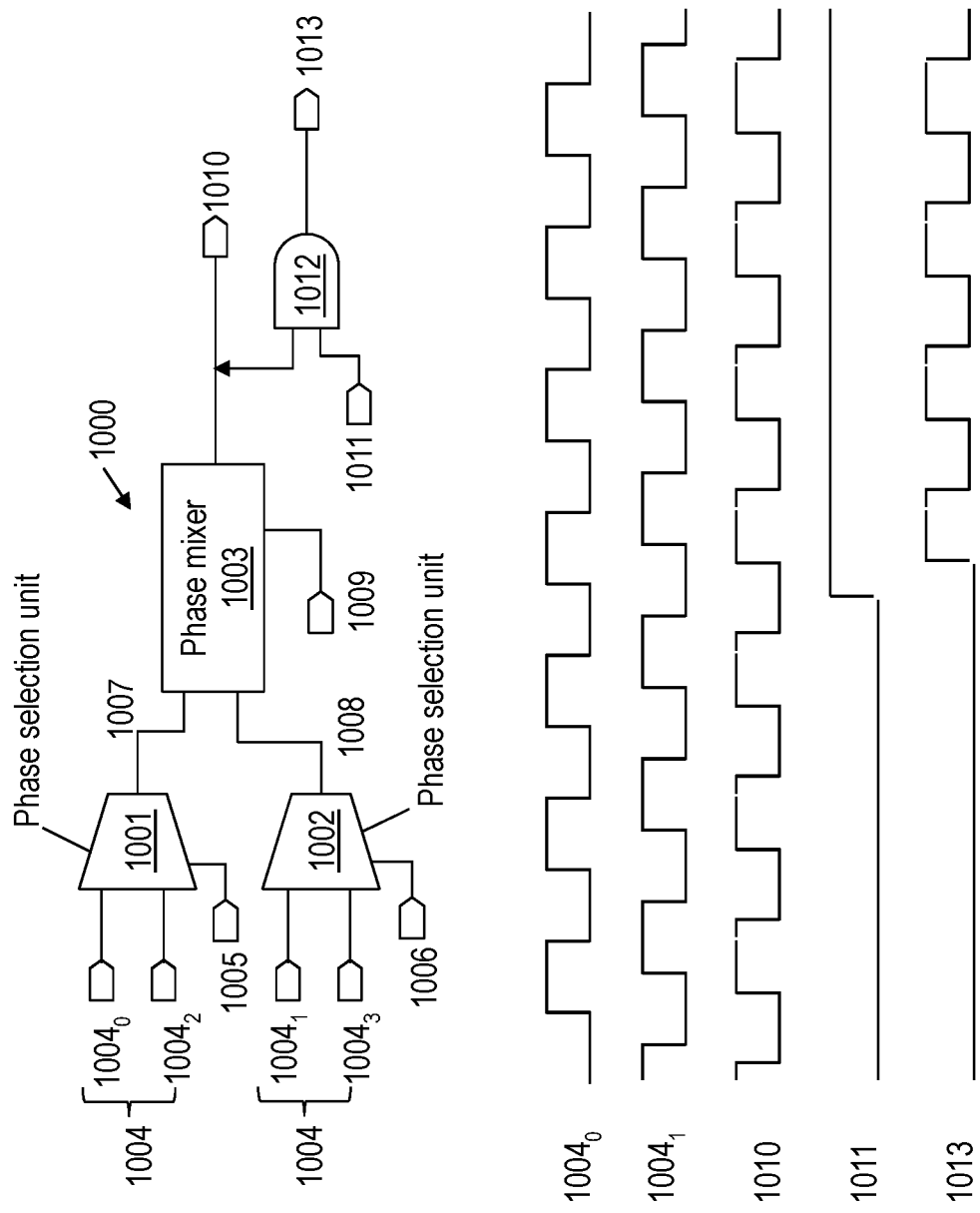

FIG. 10 shows a phase rotator structure 1000 in accordance with aspects of the invention. Elements and signals 1001-1010 of structure 1000 are similar to elements and signals 101-110 of structure 100 of FIG. 1, respectively. In embodiments, structure 1000 further includes input 1011, logic element 1012, and output 1013. Input 1011 is a test enable signal. Logic element 1012 is a signal gating structure, such as an AND gate for example, that only passes the rotated signal 1010 to output 1013 when test enable 1011 is asserted. Output 1013 is a dedicated test output for connection to one of the phase rotator test buses (e.g., buses 306 and 307) while output 1010 is used as the functional clock for use by transmit or receive units.

In aspects, structure 1000 allows for a reduction in load on the functional clock and a reduction in power in a functional mode. Structure 1000 separates the timing and loading concerns for functional design from those of test design. In embodiments, structure 1000 does not test output 1010 beyond the input connection to unit 1012, which may also be the case for structure 300 of FIG. 3 where outputs 311 are not tested beyond switches 303 and 305. This is not a concern, however, as output 1010 may be tested as part of the loopback test described in reference to FIG. 2. The depicted waveform of output 1013 illustrates that the waveform of output 1010 is only propagated on output 1013 when the enable signal 1011 is asserted. The logic function 1012 and enable signal 1011 polarity may be changed without departing from the scope the invention. As but one example, unit 1012 may be implemented as a NAND gate that inverts signal 1010 when selected. Block 1012 could also incorporate the switch/select function (e.g. switches 303).

FIG. 11 shows an embodiment of a test structure 1100 in accordance with aspects of the invention. Structure 1100 includes elements and signals 1101-1107 and 1111 that correspond to (e.g., are the same as) elements and signals 301-307 and 311 of structure 300 of FIG. 3, respectively. In embodiments, structure 1100 includes a phase detector 1108 as the compare element instead of a logic element (e.g., logic 308 of FIG. 3). Use of phase detector 1108 as the compare element provides improved testing accuracy and/or additional test information. The phase detector 1108 may be an analog phase detector or a bang-bang phase detector and may include inputs 1109 which may, among other things, determine the sensitivity or dead-band of the detector 1108. While shown as a single output, pass/fail indicator 1110 may be a single signal or multiple signals. Phase detector 1108 may be used as a replacement for the logic unit described above in which case the lock condition for any given first phase rotator phase and weight versus any given second phase rotator phase and weight can be predicted. Phase detector 1108 may be used in combination with increment/decrement logic in order to phase align a second phase rotator relative to a first phase rotator with phase/weight comparison as a pass/fail criteria, as described in greater detail with respect to FIG. 27.

FIG. 12 shows an embodiment of a test structure 1200 in accordance with aspects of the invention. Structure 1200 includes elements and signals 1201-1207 and 1211 that may be similar to corresponding elements and signals 301-307 and 311 of structure 300 of FIG. 3, respectively. In embodiments, first test bus 1206 is limited in connection to only one phase rotator 1201$_0$ instead of larger number of phase rotators as in FIG. 3. Switch 1203$_0$ is optional and may be provided to equate timing with second test bus 1207 that is connected using switches 1205$_1$ to service phase rotators 1201$_{1:n}$. If switch 1203$_0$ is removed from structure 1200, switch select control 1202 may also be removed. Additionally, switch select 1204 is configured to control all n−1 switches which gate phase rotator outputs 1211$_{1:n}$ onto second test bus 1207. Compare element 1208 of structure 1200 may be logic (e.g., similar to logic 308 of FIG. 3) or a phase detector (e.g., similar to phase detector 1108 of FIG. 11). Structure 1200 may be used to optimize test flow as only a single phase rotator 1201$_0$ with its output 1211$_0$ is used as the test standard for all other phase rotators 1201$_{1:n}$ under test.

Figure 13:
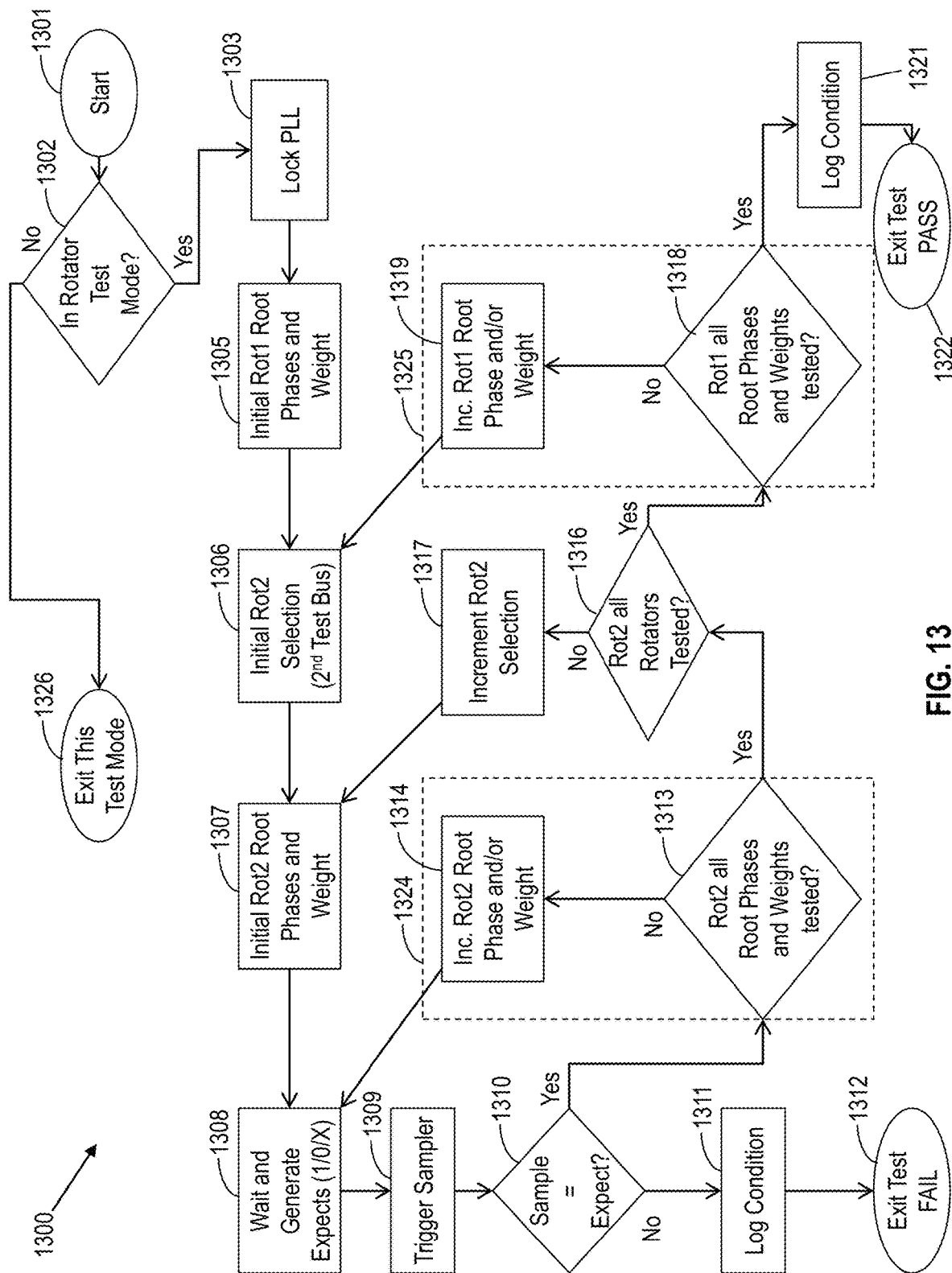
FIGS. 13 and 14 show flows of processes in accordance with aspects of the invention.

FIG. 13 shows a flow 1300 of a process in accordance with aspects of the invention. In particular, the flow 1300 is a test flow that may be used with the test structure 1200 of FIG. 12 and certain ones of the steps of the flow are described with respect to reference numbers used in FIG. 12. Flow 1300 is similar to flow 600 described with respect to FIG. 6 with at least one exception that the outer most loop is removed (e.g., the outermost loop that queries the test status to determine whether all phase rotators in the plurality available for connection to the first test bus are have been tested and, if not, increments the phase rotator selected onto the first test bus). The loop reduction is the result of first test bus 1206 of structure 1200 being associated only with phase rotator 1201$_0$ as depicted in FIG. 12. As a result, steps 1301-1303, 1305-1314, 1316-1319, and 1322-1326 may be performed in a manner similar to steps 601-603, 605-614, 616-619, and 622-626 of FIG. 6.

Figure 14:
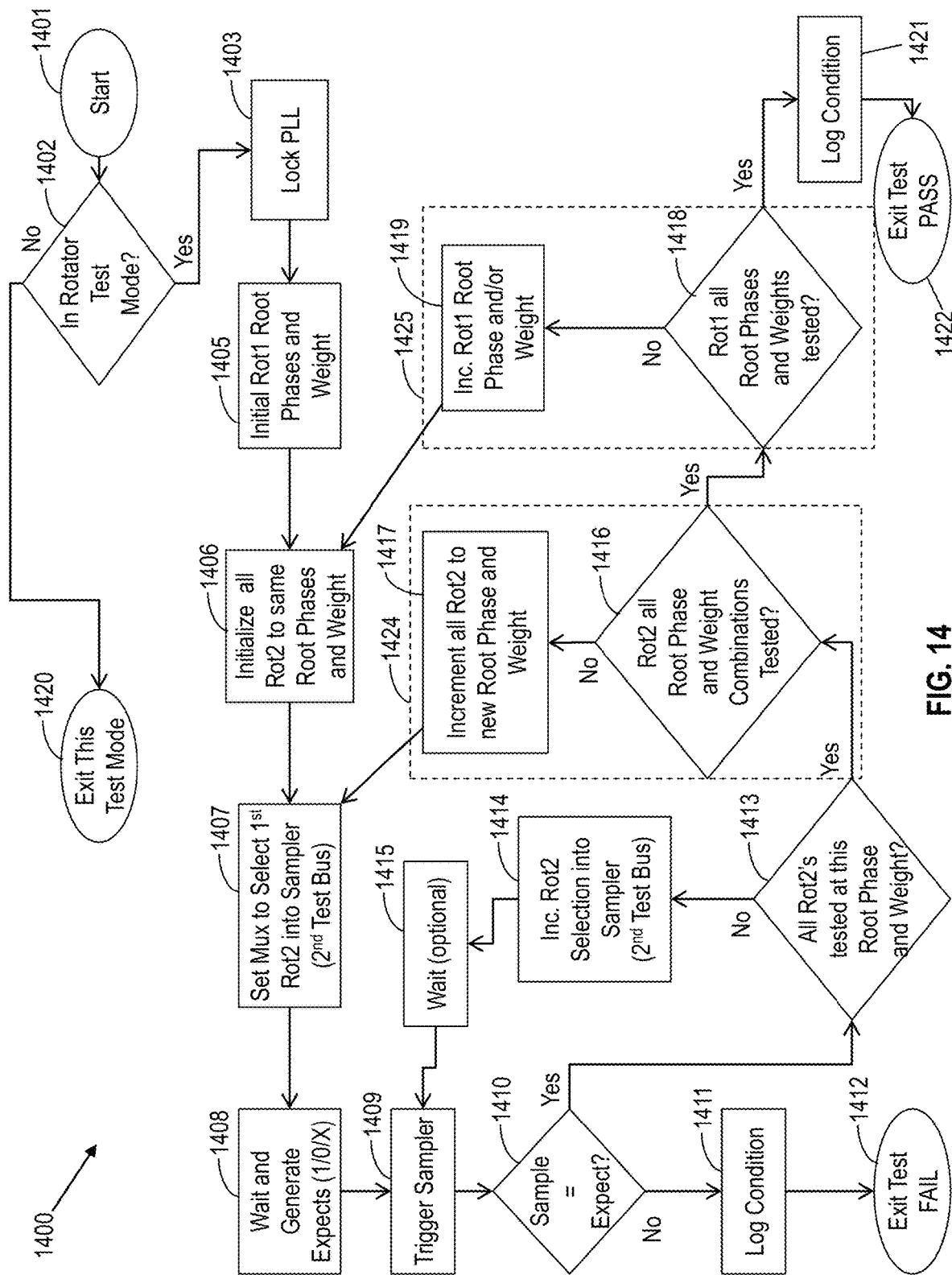

FIG. 14 shows a flow 1400 of a process in accordance with aspects of the invention. In particular, the flow 1400 is a test flow that may be used with the test structure 1200 of FIG. 12 and certain ones of the steps of the flow are described with respect to reference numbers used in FIG. 12. The process starts at step 1401. At step 1402, it is determined if the phase rotator test mode is active/initiated. If the phase rotator test is not active, the phase rotator test process is exited at step 1420. Alternatively, if the phase rotator test is in progress, the PLL is locked at step 1403 and the first phase rotator which is connected to the first test bus (e.g., bus 1206 of FIG. 12) is set to a first phase and weight condition at step 1405.

At step 1406, all second phase rotators, i.e. in the plurality of phase rotators connectible to the second test bus 1207 of FIG. 12, are set to an identical first phase and weight condition that may or may not be equivalent to the first phase and weight condition of the first phase rotator. As such the plurality of second phase rotators should have the same phase output at step 1406. With the second phase rotators set up, one of the second phase rotators is selected onto the second test bus 1207 at step 1407 and the process enters a wait state 1408 to allow the plurality of second phase rotators to settle into the selected phase. During step 1408, the predicted expect value is generated for the given relative phase/weight set point of the first phase rotator relative to the second phase rotator. When step 1408 completes, the logic or phase detector (e.g., compare element 1208) output that checks the relative phase positions of the first and second phase rotators is sampled at step 1409.

At step 1410, the sample from step 1409 is checked against the expect value from step 1408. If the sample does not match the expect value, the process moves to step 1411 where the fail is logged and process exits at 1412 with a failure. Alternatively, if the sample matches the expect value, the process moves to step 1413 where it is determined if all second phase rotators within the plurality of second phase rotators have been tested at the current phase and weight setting. If the entire plurality has not been tested, the process moves to step 1414 where the next second phase rotator in the plurality of phase rotators connectible to the second test bus is selected and the process moves either to optional step 1415, which provides for a wait state, or directly to 1409 where sampling of the compare between the first phase rotator phase, and the latest second phase rotator phase occurs. The loop through steps 1409, 1410, 1413, 1414 and optionally step 1415 continues until all second phase rotators in the plurality have been tested at the phase and weight selected at step 1406.

Wait state at step 1415 may be utilized in some implementations. As an example, when compare element 1208 is a piece of combinational logic, the result should be the same at every phase rotator cycle, and the wait provided at step 1408 would be sufficient. However, when compare element 1208 is a phase detector, it may take multiple phase rotator cycles to determine whether the first and second phase rotators are locked. While step 1408 provides this time for the initial second phase rotator selection, wait state at step 1415 may be used to test any increment of the second phase rotator by step 1414.

Still referring to FIG. 14, after all second phase rotators have been tested at the phase and weight condition set in 1406, step group 1424 which includes steps 1416 and 1417 is used to determine if all desired phase and weight combinations for the second phase rotators have been tested. If not, the next phase and weight combination is provided to all second phase rotators in the plurality and the process returns to step 1407. The loop through 1407, 1408, 1409, 1410, 1413, 1414, 1415, 1416 and 1417 continues until the plurality of second phase rotators has been tested at all desired phase and weight combinations against the first phase rotator weight set in 1405. Step group 1424 may be implemented in a manner similar to that described in process 700 of FIG. 7.

With continued reference to FIG. 14, when step 1416 is true or positive, the process moves to step group 1425 that includes steps 1418 and 1419. The functions of step group 1425 may be implemented in a manner similar to process 700 of FIG. 7, but with checking to ensure that all desired phase and weight combinations for the first phase rotator have been tested. If all combinations have not been tested, the next phase and weight setting in the group of settings to be tested for the first phase rotator is selected, and the process returns to step 1406, where upon the inner test loop which checks all second phase rotators at all desired phase and weight combinations against the current first phase rotator phase and weight setting is repeated. Once all first phase rotator phases and weights are covered, the process exits to step 1421 where the successful test condition is logged, followed by step 1422 which is the phase rotator test exit with pass result.

Figure 15:
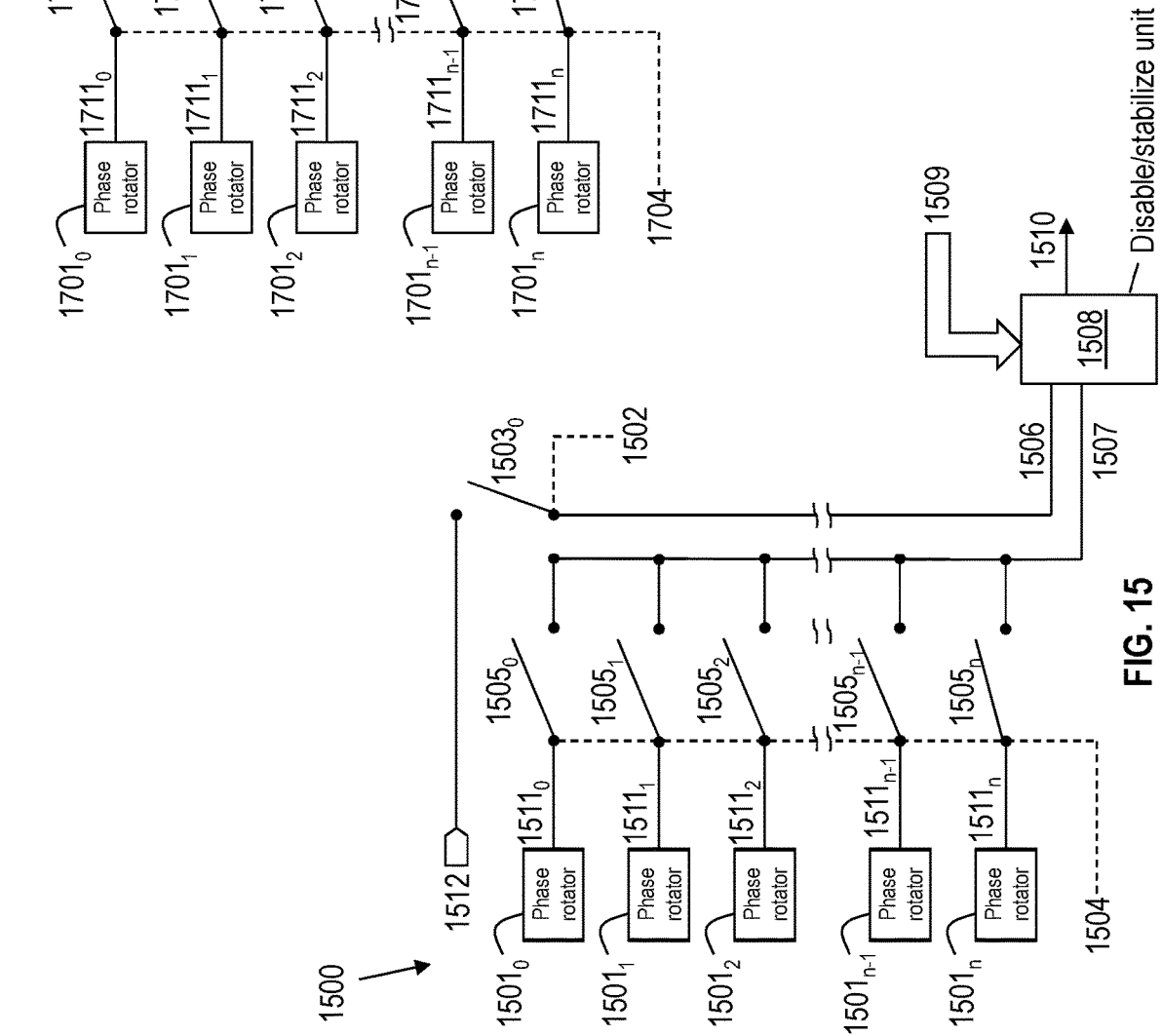
FIG. 15 shows a phase rotator test structure in accordance with aspects of the invention.

FIG. 15 shows an embodiment of a test structure 1500 in accordance with aspects of the invention. Structure 1500 includes elements and signals 1501-1511 that may be similar to corresponding elements and signals 1201-1211 of structure 1200 of FIG. 12, respectively. In embodiments, first phase rotator 1501$_0$ with phase output 1511$_0$ is only connectible to second test bus 1507 via switch 1505$_0$, while switch control 1504 controls the selection from the plurality of phase rotators under test. The frequency/phase source for first test bus 1506 is provided by source 1512 with optional switch 1503$_0$ and control 1502. Phase/frequency source 1512 may be provided from off-chip or from another on-chip source. The phase relationship between source 1512 and phase clocks generated as inputs to each of the phase rotator 1501$_{0:n}$ is known in order to generate result prediction. Switch 1503$_0$ with control 1502 may be optionally provided to disable/stabilize unit 1508 in non-phase rotator-test modes.

Figure 16:
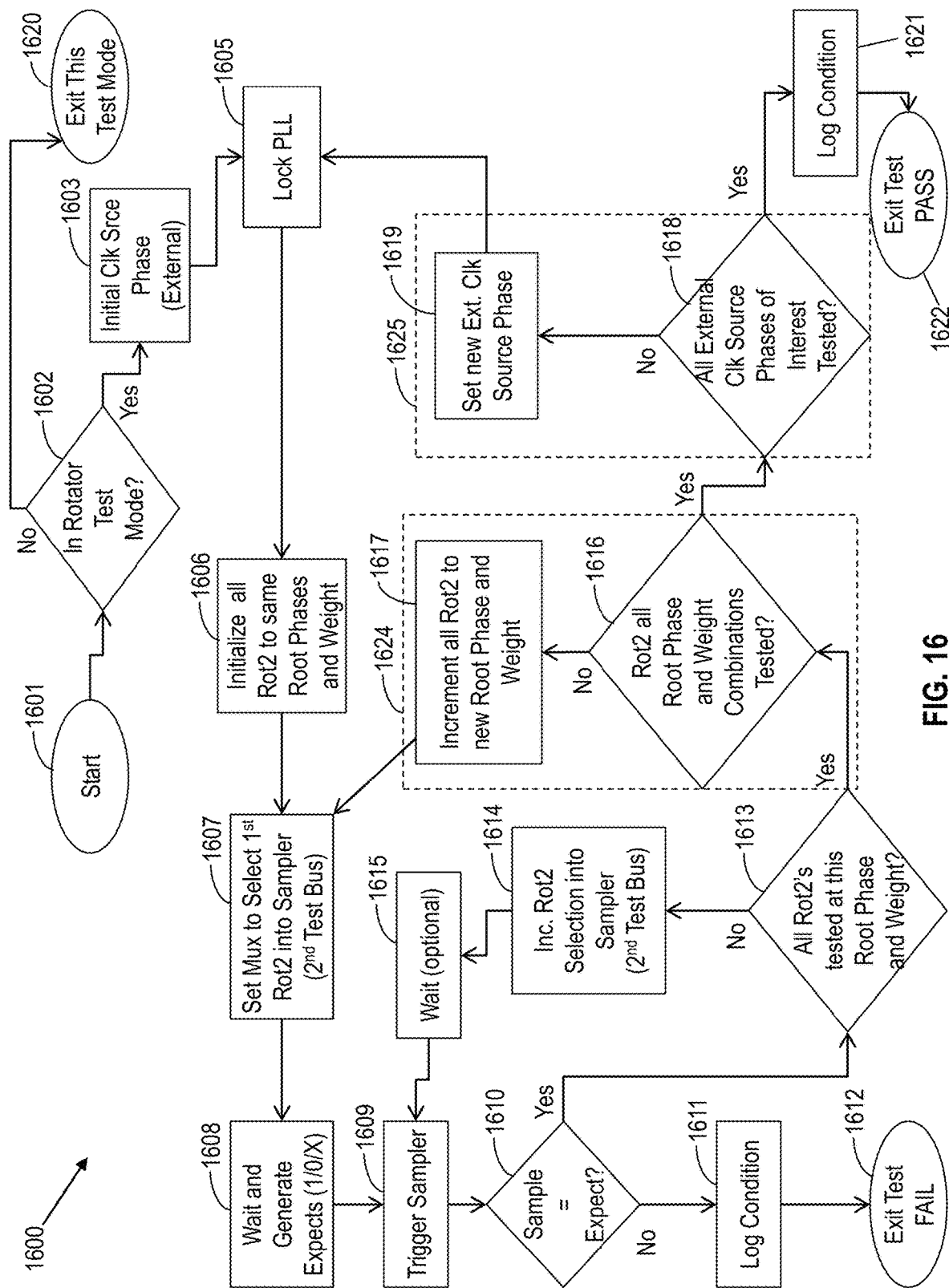
FIG. 16 shows a flow of a process in accordance with aspects of the invention.

FIG. 16 shows a flow 1600 of a process in accordance with aspects of the invention. In particular, the flow 1600 is a test flow that may be used with the test structure 1500 of FIG. 15 and certain ones of the steps of the flow are described with respect to reference numbers used in FIG. 15. Flow 1600 is similar to flow 1400 of FIG. 14 with at least one exception that, because phase rotator 1501$_0$ is part of the plurality of phase rotators connectible to the second test bus 1507, there is no need to initialize the phase and weight selection for the first phase rotator. The process starts at 1601. At step 1602, it is determined if the phase rotator test mode is active/initiated. If the phase rotator test is not active, the phase rotator test process is exited at step 1620. Alternatively, if the phase rotator test is in progress, the initial clock source phase is set at step 1603 and the PLL is locked at step 1605.

At step 1606, the plurality of second phase rotators is set to a first phase and weight setting such that each phase rotator in the plurality should have identical output phase. At step 1607, a first phase rotator in the plurality of second phase rotators is connected to the test bus. At step 1608, phase settling and expect value generation is performed. In the loop comprised of steps 1609, 1610, 1613, 1614 and optionally step 1615, checking of each phase rotator in the plurality at a fixed phase and weight setting is performed, in accordance with the description provided in reference to flow 1400 in FIG. 14. Further steps 1616 and 1617 provide additional looping to verify functionality at the full set of phases and weights desired for the plurality of second phase rotators.

At step 1618, it is determined if any additional input phases beyond that set in step 1603 are required for test of phase rotators 1501$_{0:n}$. If additional phases are required, the next phase is set up at step 1619 and the PLL is re-locked at step 1605. This loop continues until all clock source phases of interest are tested. Once all first phase rotator phases and weights are covered, the process exits to step 1621 where the successful test condition is logged, followed by step 1622 which is the phase rotator test exit with pass result.

In embodiments of flow 1600, the external clock phase is the clock phase used for PLL reference (or alternatively a delay line reference). This enforces a known relationship between the phase inputs to phase rotators 1501$_{0:n}$ and the expected phase outputs 1511$_{0:n}$ from the phase rotators. If the external clock phase is not used to lock the PLL, a test flow is still possible in which step 1619 loops to step 1606 and the phase relationship between the test clock reference 1512 connected to first test bus 1506 and the phase inputs to phase rotators 1501$_{0:n}$ is determined in order to provide result prediction. Alternatively, a method of phase lock testing, such as that described with respect to FIG. 27, may be used. Steps 1618 and 1619 are optional. Given that at successful exit of step 1616, both the phase and weight connections/functionality have been verified for the plurality of phase rotators under test; therefore, additional phases to test against may not be required.

Figure 17:
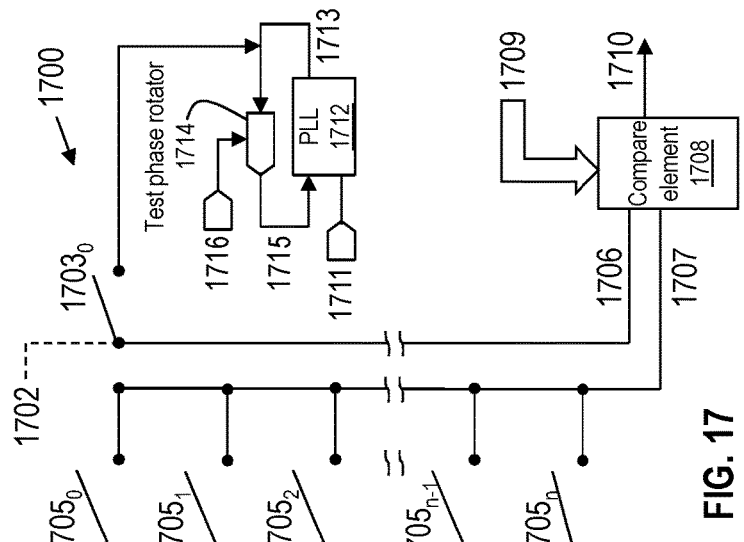
FIG. 17 shows a phase rotator test structure in accordance with aspects of the invention.

FIG. 17 shows an embodiment of a test structure 1700 in accordance with aspects of the invention. Structure 1700 includes elements and signals 1701-1711 that may be similar to corresponding elements and signals 1201-1211 of structure 1200 of FIG. 12, respectively. In embodiments, switch 1703$_0$ is configured to selectively connect a reference PLL feedback phase 1713 output from PLL 1712 to first test bus 1706. PLL feedback phase 1713 is further connected to a test phase rotator 1714 used to alter a feedback phase 1715 provided to an input of the PLL 1712. Control lines 1716, which may be controllable externally or from a BIST structure, such as BIST 915 of FIG. 9, may be used to alter the phase of the feedback and therefore shift the phase of the feedback phase 1713 which is provided for comparison on first test bus 1706. PLL input 1711 is a reference clock. Whereas reference clock 1511 of FIG. 15 uses a phase shift in order to test phase rotators 1501$_{0:n}$ at multiple phases, phase movement of reference 1711 is not required since shifting of the reference clock is provided via phase rotator 1714. Test of phase rotator 1714 may be omitted as part of the phase rotator test described, but may be part of a PLL lock test which preferably is conducted prior to any phase rotator testing.

Figure 18:
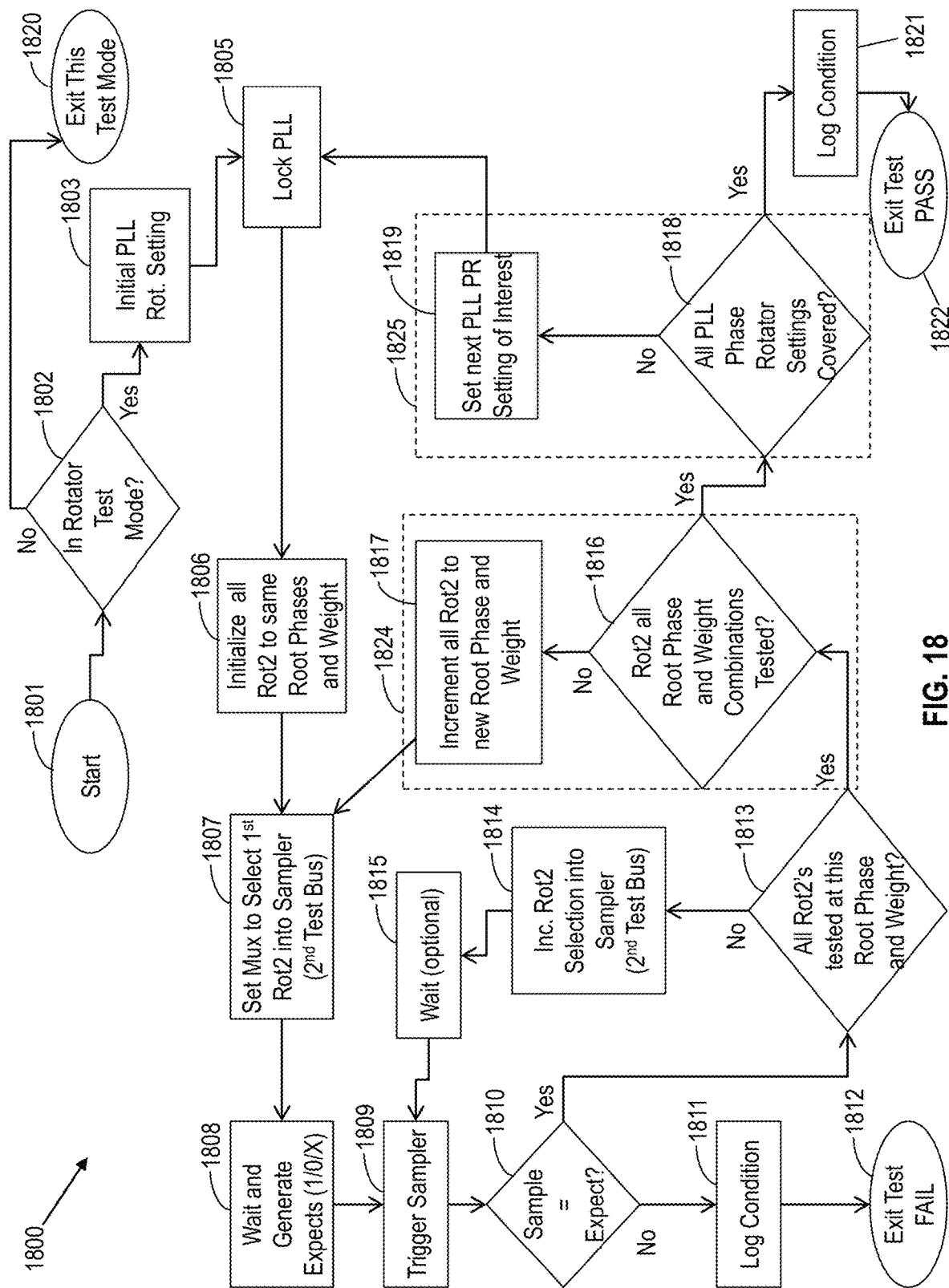
FIG. 18 shows a flow of a process in accordance with aspects of the invention.

FIG. 18 shows a flow 1800 of a process in accordance with aspects of the invention. In particular, the flow 1800 is a test flow that may be used with the test structure 1700 of FIG. 17, e.g., to test phase rotators 1701$_{0:n}$, and certain ones of the steps of flow 1800 are described with respect to reference numbers used in FIG. 17. In aspects, steps 1801, 1802, 1805-1817, 1820-1822 may be performed in a manner similar to corresponding steps 1601, 1602, 1605-1617, 1620-1622 of flow 1600 of FIG. 16.

In embodiments, step 1818 includes determining whether or not all desired PLL phase rotator settings have been tested, and step 1819 includes advancing the PLL phase rotator setting to the next desired value. Because structure 1700 of FIG. 17 is dependent on the PLL 1712, step 1819 exits to step 1805 in order to re-lock the PLL 1712. Steps 1818 and 1819 are optional, as successful exit from step 1816 guarantees that at minimum all phase input connections and all weight input connections, as well as expected functionality for the plurality of phase rotators has been tested.

Figure 19:
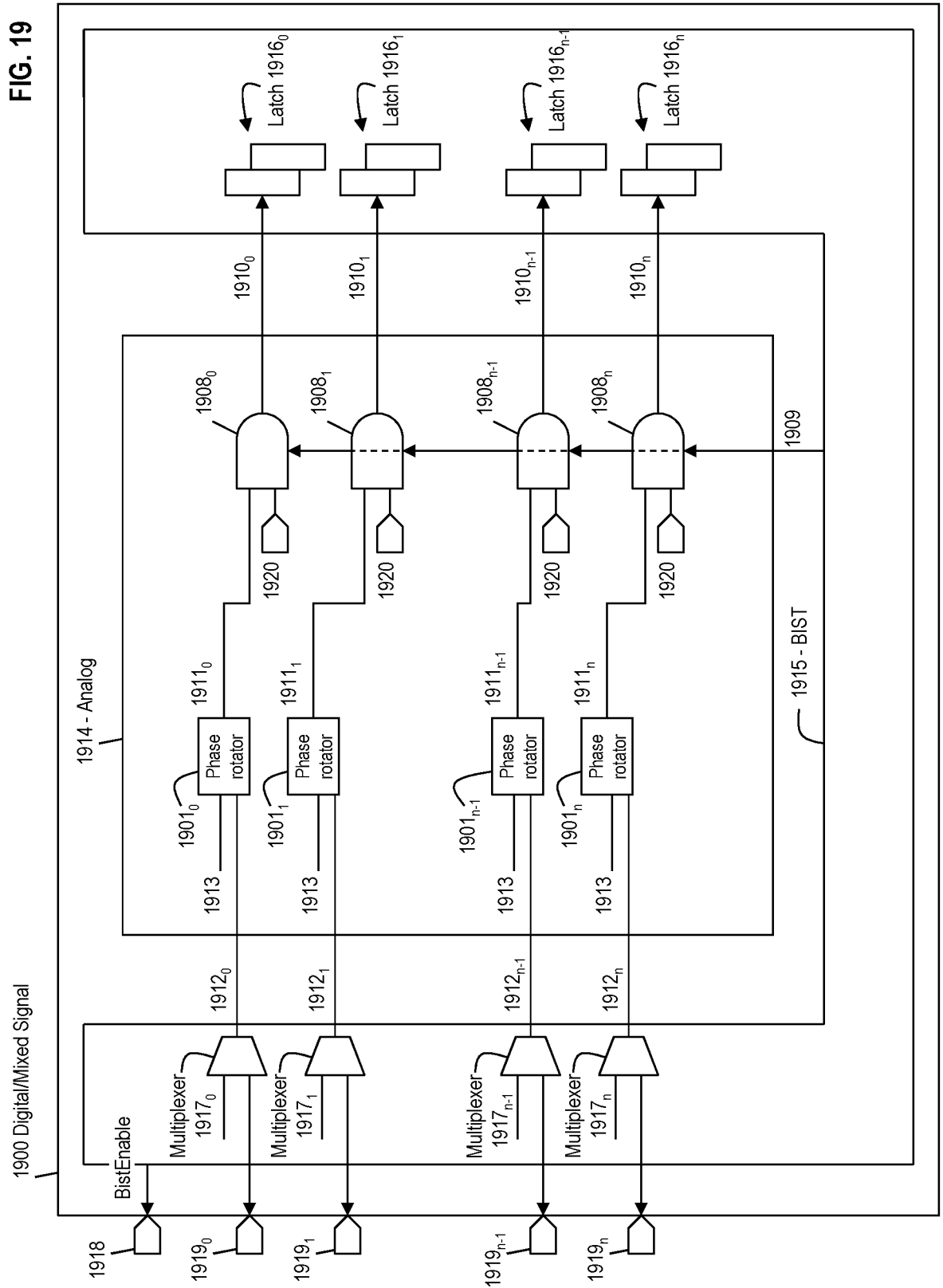
FIG. 19 shows a phase rotator test structure in accordance with aspects of the invention.

FIG. 19 shows a test structure 1900 in accordance with aspects of the invention. Structure 1900 is a mixed-signal structure including a BIST 1915 is forms a wrapper around analog sub-unit 1914. Analog sub-unit includes 1914 phase rotators 1901$_{0:n}$ that may be the same as phase rotators 901$_{0:n}$ of structure 900 of FIG. 9. BIST 1915 includes multiplexers 1917$_{0:n}$ that may be the same as multiplexers 917$_{0:n}$ of structure 900 of FIG. 9. Signals 1911-1913, 1918, and 1919 depicted in FIG. 19 may be the same as or similar to signals 911-913, 918, and 919 depicted in FIG. 9, respectively.

In embodiments, analog sub-unit 1914 includes a plurality of logic/phase detector units elements 1908$_{0:n}$, each of which may be the same as or similar to element 908 of structure 900 of FIG. 9. Each instance of elements 1908$_{0:n}$ is dedicated to one instance of phase rotators 1901$_{0:n}$. All instances of elements 1908$_{0:n}$ share common control/tuning 1909 provided by BIST 1915 and a common first test bus connection 1920. In this manner, each phase rotator 1901$_{0:n}$ is tested against a common clock reference. In structure 1900, all phase rotators 1901$_{0:n}$ are tested in parallel, reducing looping time at the expense of additional hardware. The results of testing the phase rotators 1901$_{0:n}$, indicated at outputs 1910$_{0:n}$, are stored in latches 1916$_{0:n}$, which may be similar to latch 916 of FIG. 9.

Figure 20:
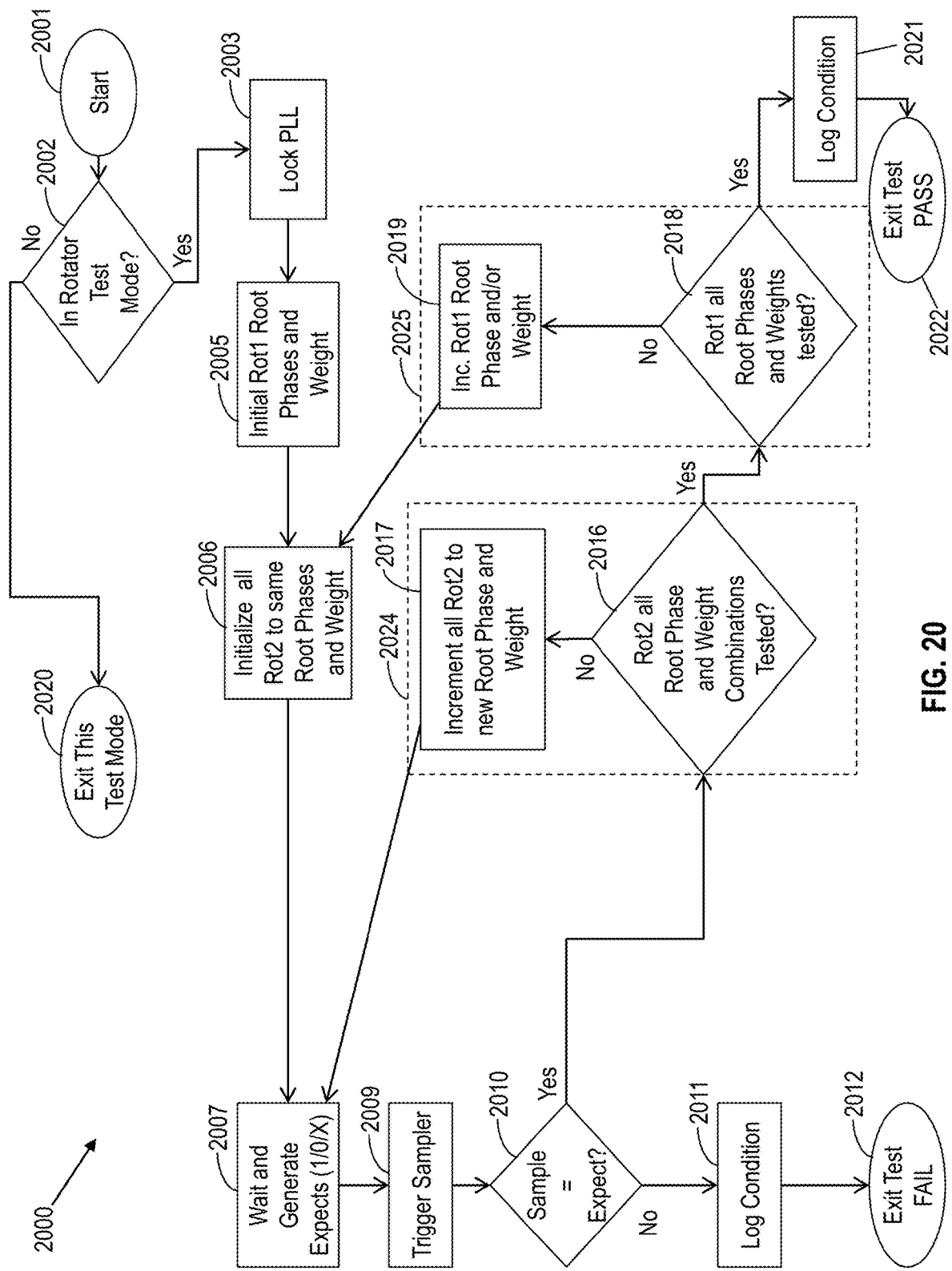
FIG. 20 shows a flow of a process in accordance with aspects of the invention.

FIG. 20 shows a flow 2000 of a process in accordance with aspects of the invention. In particular, the flow 2000 is a test flow that may be used with the test structure 1900 of FIG. 19, e.g., to test phase rotators 1901$_{0:n}$, and certain ones of the steps of flow 2000 are described with respect to reference numbers used in FIG. 19.

In embodiments, flow 2000 is drawn for a case in which the common reference 1920 is one of the plurality of phase rotators under test, e.g., as in structure 1200 of FIG. 12. The process starts at 2001. At step 2002, it is determined if the phase rotator test mode is active/initiated. If the phase rotator test is not active, the phase rotator test process is exited at step 2020. Alternatively, if the phase rotator test is in progress, the PLL is locked at step 2003 and the phase and weight of the phase rotator connected to the first test bus is set to a first value at step 2005. All remaining phase rotators are set to a common phase and weight at step 2006.

At step 2007, phase rotator settling occurs during a wait state and expects (e.g., expected values) are generated. Steps 2009 and 2010 sample the checking result and compare it to the expect value from step 2007. Steps 2009 and 2010 are done in parallel for each unique phase rotator 1901$_{0:n}$ and sampler 1908$_{0:n}$ pair. As long as the result meets expectations, the process will move to step 2016 where it is determined whether all phase and weight combinations desired for test have been covered. If they have not been covered, then at step 2017 all phase rotators not used as common reference 1920 are incremented and the loop through step 2007 will repeat until all combinations are tested. The parallel checking of all phase rotators eliminates an inner loop in the flow. As in prior flows (e.g., flow 1800) subgroup 2024 may be implemented in the manner described with respect to flow 700 of FIG. 7.

Successful exit from step 2016 is followed by optional execution of steps 2018 and 2019 which check and increment the clock source providing the reference to input 1920 within structure 1900. When the source is one of the plurality of phase rotators under test, this loop is used to test all desired combinations of phase and weight for the first phase rotator generating the input 1920. If, on the other hand, input 1920 is sourced externally or from a PLL, e.g., as illustrated in FIG. 17, these steps may be omitted. Alternatively, the tests increment targets and process forwarding may be adapted to that illustrated in either of FIGS. 16 and 18 for the outermost loop.

Figure 21:
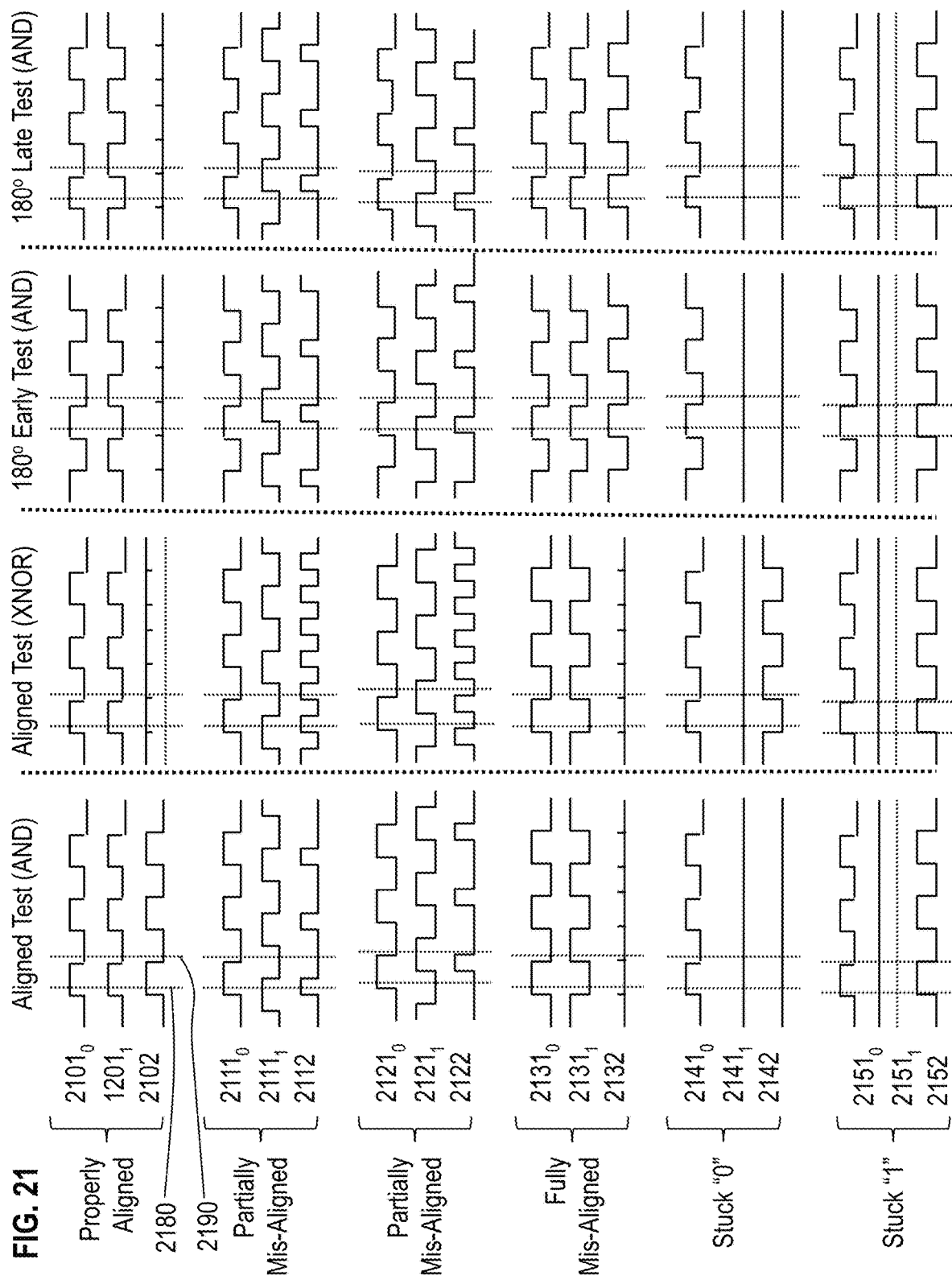
FIG. 21 shows exemplary pattern sets for phase rotator testing.

FIG. 21 depicts a pattern set for a phase rotator test illustrating logic function testing of the phase comparison result in accordance with aspects of the invention. As depicted in FIG. 21, a first clock source is compared against a second clock source. The first clock source may be provided by a phase rotator, an external source, or a PLL. The second clock source may be provided by a phase rotator under test using a first pattern type which is expected to provide phase alignment between the first and second clock sources. A second pattern type may also be provided to the phase rotator under test, the second pattern type being expected to provide 180° phase misalignment between the first and second clock sources.

FIG. 21 illustrates two tests for the first pattern type "Aligned Test (AND)" and "Aligned Test (XNOR)". FIG. 21 illustrates an AND test for the second pattern type in two configurations: a first where the positive pulse of signals {2101$_0$, 2111$_0$, 2121$_0$, 2131$_0$, 2141$_0$, 2151$_0$} is nominally earlier than that of signals {2101$_1$, 2111$_1$, 2121$_1$, 2131$_1$, 2141$_1$, 2151$_1$}; and a second where the positive pulse of signals {2101$_0$, 2111$_0$, 2121$_0$, 2131$_0$, 2141$_0$, 2151$_0$} is nominally later than that of signals {2101$_1$, 2111$_1$, 2121$_1$, 2131$_1$, 2141$_1$, 2151$_1$}. Timing markers 2180 and 2190 show trigger points relative to the rising and falling edges of first clock sources {$2101_0$, $2111_0$, $2121_0$, $2131_0$, $2141_0$, $2151_0$} that are used to sample logic outputs {2102, 2112, 2122, 2131, 2142, 2152}. The patterns in FIG. 21 depict differentiating a pair of clock sources that are properly aligned from pulses which are partially misaligned, fully misaligned, or have one or more nodes stuck. The diagramming of FIG. 21 covers the case in which the second clock source {$2141_1$, $2151_1$} is stuck. When either of first clock source {$2141_0$, $2151_0$} are stuck, the sampling mechanism, which for this example is based on the first clock source, does not operate and the result is detectable as long as the sampling latches were reset to known, non-passing values prior to the test sample.

FIGS. 22a-i show tables based on analysis of the waveforms of FIG. 21 in accordance with aspects of the invention. FIGS. 22a-i show nine scenarios for various logic tests and edges on which to perform the test. All of the testing scenarios illustrated provide an identical result for either the properly aligned case, or the first of two slightly misaligned cases. The degree to which a slightly misaligned case produces a sample value equivalent to the fully aligned case is a design item related to the placement of the sampling point relative to the first reference clock and the amount of misalignment acceptable in the test. A solution for manufacturing testing with reasonable limits is possible to construct. For example, at least one of tuning, control, and expect generation may account for some degree of uncertainty when phases are at or near expected alignment, and the pattern set may be augmented to ascertain acceptance. In all but FIG. 22e and FIG. 22f, the aligned and slightly-misaligned cases can be differentiated from other failing combinations. FIG. 22e and FIG. 22f provide erroneous passing signatures and should be omitted from use in logic testing. A viable alternative is FIG. 22b, which tests using only AND at the rising edge.

Figure 23:
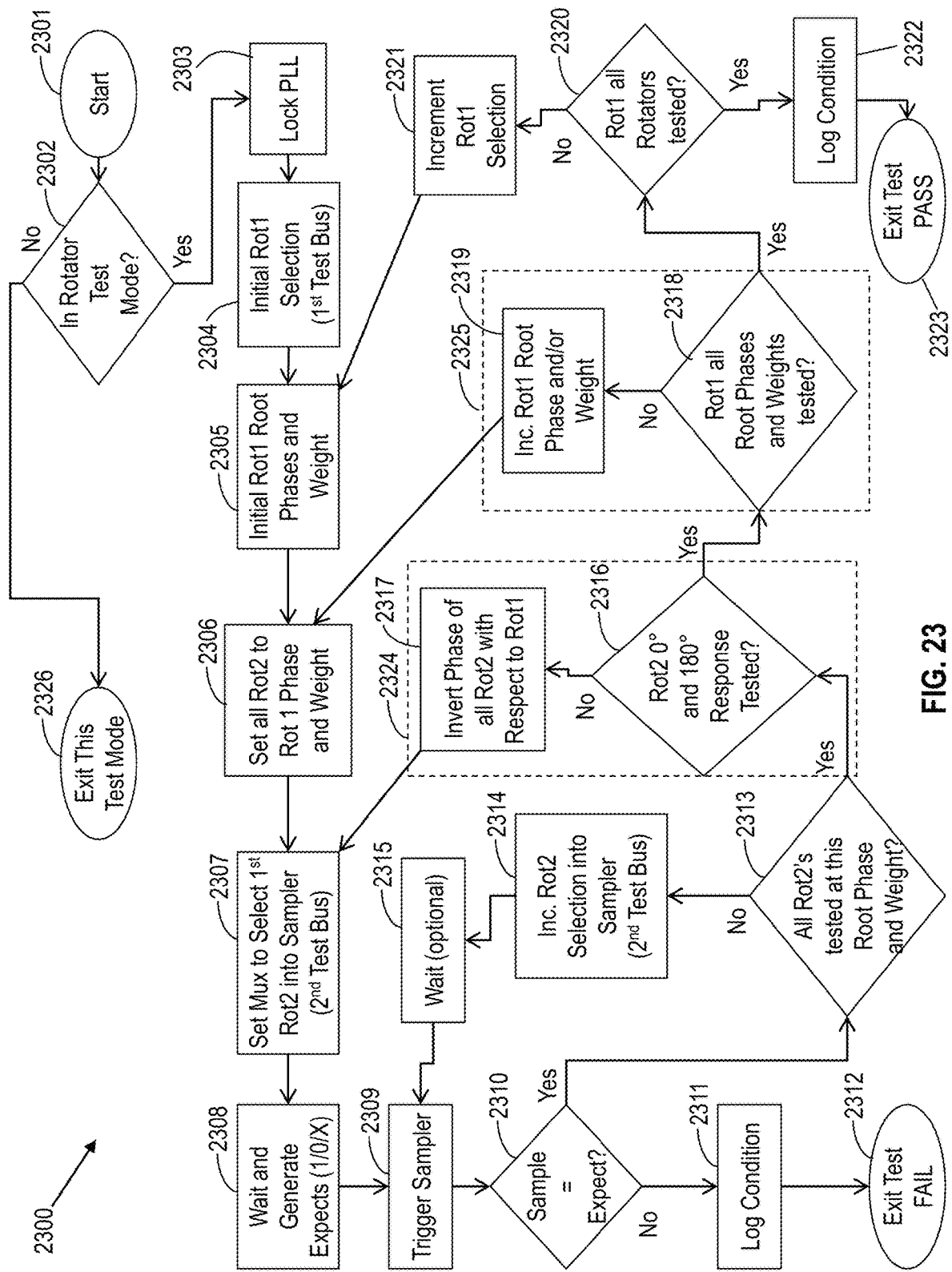
FIGS. 23 and 24 show flows of processes in accordance with aspects of the invention.

FIG. 23 shows a flow 2300 of a process in accordance with aspects of the invention. In particular, the flow 2300 is a test flow that may be used with the test structure 300 of FIG. 3 by applying testing as depicted in one or more of FIGS. 21 and 22a-i. Certain ones of the steps of flow 2300 are described with respect to reference numbers used in FIG. 3. The flow starts at step 2301. At step 2302 it is determined if the phase rotator test mode is initiated/active. If the phase rotator test mode is not initiated, the process ends at step 2326. If the phase rotator test mode is initiated, the process moves to step 2303 where the PLL is locked. At step 2404, one phase rotator (e.g., first phase rotator Rot1) of a first plurality of phase rotators connectible to the first test bus is connected to the test bus. At step 2305, input phase selection and weight selection for first phase rotator is made. At step 2306, the phase and weight selection used for first phase rotator is set for the plurality of phase rotators which may be selected for connection to the second test bus.

At step 2307, one phase rotator (e.g., second phase rotator Rot2) of the second plurality of phase rotators which may be selected for connection to the second test bus is connected. At step 2308, a wait state for phase rotator settling and expect generation occurs. At step 2309, the sample of the comparison result for the phases of first and second phase rotator is made. At step 2310, the result of step 2309 is checked against the expect value of step 2308. If the result of step 2310 is positive or true, i.e., if the test passes, then at step 2313 a check is performed to insure that all phase rotators in the second plurality have been poled at the current phase and weight setting. At step 2314, the second phase rotator (Rot2) in the second plurality phase rotators is incremented. At step 2315, an optional wait is performed. The loop through steps 2314, 2323, 2309, 2310 and 2313 continues until all of the phase rotators in the second plurality phase rotators are polled. Step 2315 may be provided dependent on the type of sampler used and settling requirements. Successful completion of this loop completes the AND test (or alternatively a phase detect test) with aligned phases.

When the result at step 2313 is true or positive (e.g., "Yes"), then at step 2316 the second plurality of phase rotators are checked for having been tested for both 0 degree and 180 degree response (the setup in 2306 provides the 0 degree response). If the 180 degree response has not been tested, then at step 2317 the phase and weight are set to place the second plurality of phase rotators in 180 degree phase misalignment relative to the first phase rotator and the process loops back to step 2307. Successful completion of this loop completes an AND test (or alternatively a phase detect test) in the fully misaligned condition.

A true or positive result at step 2316 indicates completion of the 0 degree and 180 degree modes, after which the flow proceeds to step 2318 where the first phase rotator is checked to determine if all desired phase and weight combinations have been tested. A negative result forwards the process to 2319 where the next phase/weight setting is programmed, and then a loop beginning at 2306 is started. Successful completion of this loop insures that all phase-pair selects and all weight selects for the first phase rotator, and therefore for the second plurality of phase rotators is tested. Steps 2318 and 2319 may be performed in accordance with the flow 700 of FIG. 7.

When the result at step 2318 is true or positive, then at step 2320 a check is performed to ascertain whether all of the phase rotators in the first plurality have been tested. A negative result forwards the process to step 2321 where the next phase rotator in the first plurality is selected as the first phase rotator (Rot1) and the process loops back to step 2305. Looping continues until coverage is provided for all phase rotators in the first plurality of phase rotators. When the result at step 2320 is true or positive, then at step 2322 the conditions are logged and at step 2323 the test ends with a pass.

Figure 24:
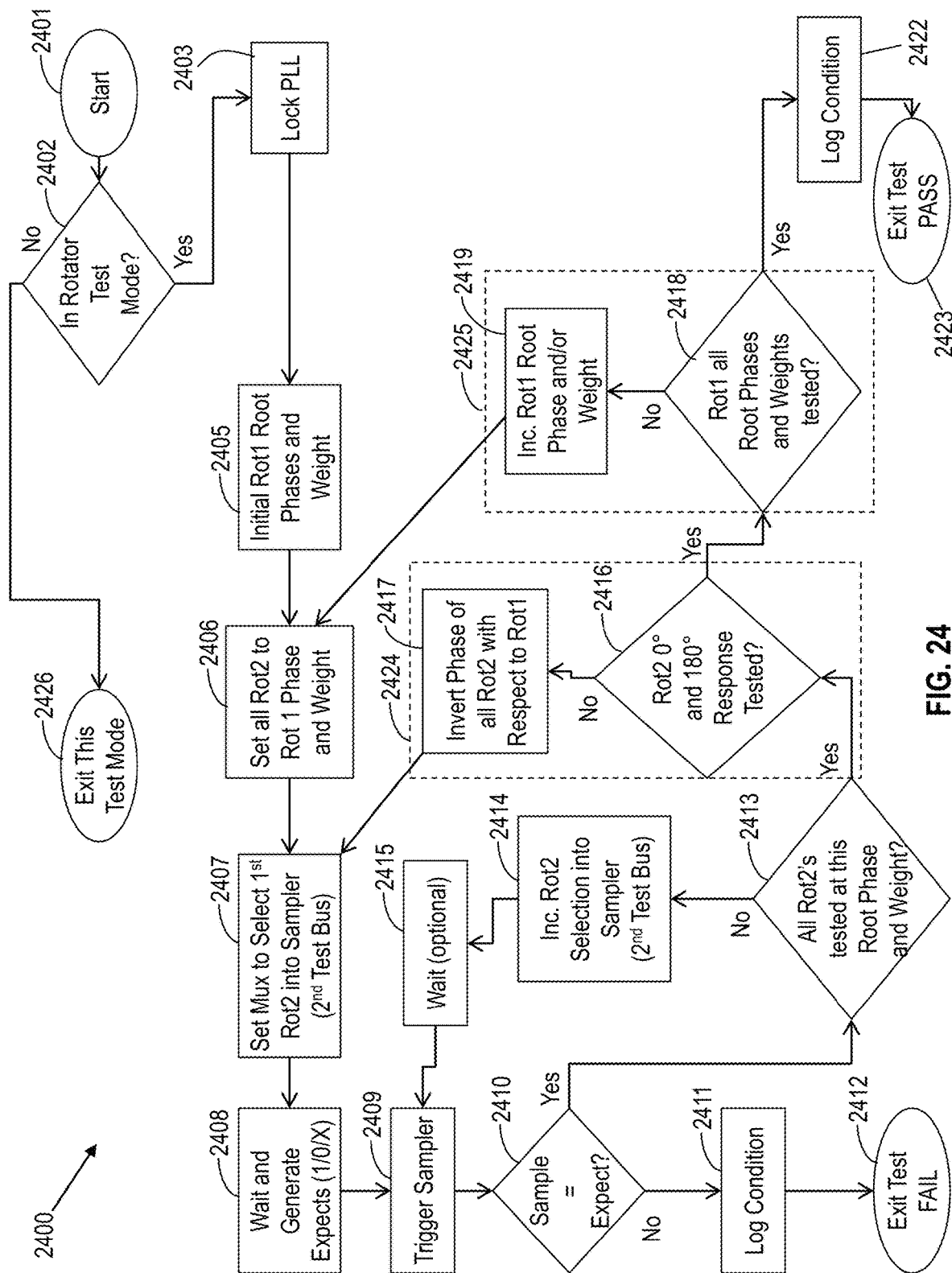

FIG. 24 shows a flow 2400 of a process in accordance with aspects of the invention. In embodiments, flow 2400 is a truncated version of flow 2300 of FIG. 23. In this case, the outer-most loop through steps 2320 and 2321 of FIG. 23 is dropped because the first plurality of phase rotators is reduced to a single phase rotator. In other aspects, steps 2401-2419, 2422, and 2423 of flow 2400 are performed in the same manner as steps 2301-2319, 2322, and 2323 of flow 2300 of FIG. 23. Truncated flows similar to flow 2400 may also be constructed for a simplified pattern set handling for any of structure 1500 of FIG. 15, structure 1700 of FIG. 17, and structure 1900 of FIG. 19.

Figure 25:
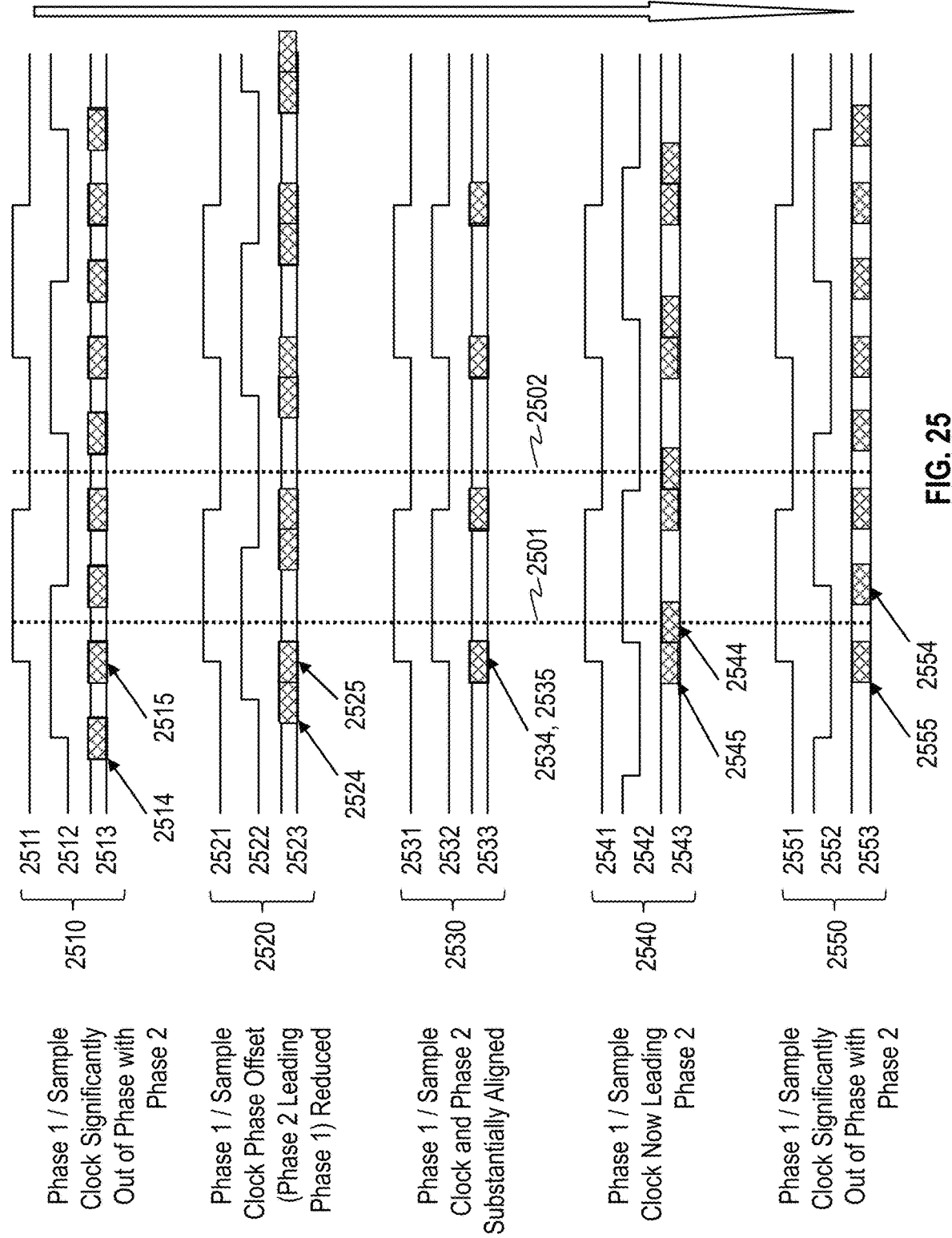
FIG. 25 shows exemplary pattern sets for phase rotator testing in accordance with aspects of the invention.

FIG. 25 illustrates measurement uncertainty regions which may occur in comparison of two mismatched phases with logic (rather than a phase detector), similar to the diagramming provided in FIGS. 21 and 22a-i. In any real system there is some amount of uncertainty as to when an incoming edge from a phase rotator arrives. The uncertainty may be due to noise, jitter, loading, time-of-flight, etc., as well as some uncertainty as to the logic delay inherent in the sampler. Regions 2514, 2515, 2524, 2525, 2534, 2535, 2544, 2545, 2554 and 2555 in FIG. 25 illustrate regions of uncertainty. In a system where the sampling point is referenced to one of the two phases under test (e.g., 2511, 2521, 2531, 2541, 2551), any uncertainty in the phase used for sampling is manageable, as the variance in logic delay can be used as a factor in placing the sampling edge relative to the incoming phase.

Uncertainty in the arrival of the second of two phases under test (2512, signal 2522, 2532, 2541, 2552) may cause sampling issues dependent on the relative difference between the first phase and the second phase. Considering group 2510 where signals 2511 and 2512 are 90 degrees out of alignment with signal 2512 leading signal 2511, a sampling point 2501 related to the rising edge of signal 2511 and a sampling point 2502 related to the falling edge of signal 2511 can be found that does not incur an uncertainty region for the second phase signal 2512.

Still referring to FIG. 25, group 2520 shows the situation where signal 2522 leads signal 2521 by less than 90 degrees and the uncertainty regions begin to merge; however, because the signal 2521 is still later than the signal 2522 edge, a valid sampling point outside the uncertainty region can be found. This continues in group 2330 where signal 2531 and signal 2532 are aligned. Continuing to push the second phase later in time in group 2540, it is seen that the uncertainty region associated with the second phase conflicts with the sampling point, and one is unsure what the measured result of a signal 2543 would be under these conditions. Moving the second phase edge even further right as shown in group 2550, there is a condition where again sampling points 2501 and 2502 have no conflict with an uncertainty region. Given the delays, jitter, process variation, noise, circuit delay, etc., there is a set of phase relationships or offsets between the first phase (Phase 1) and the second phase (Phase 2) where a detection system is exposed to uncertainty in measurement. Aspects of the invention use a phase detector or a hybrid method to handle such uncertainty.

Figure 26:
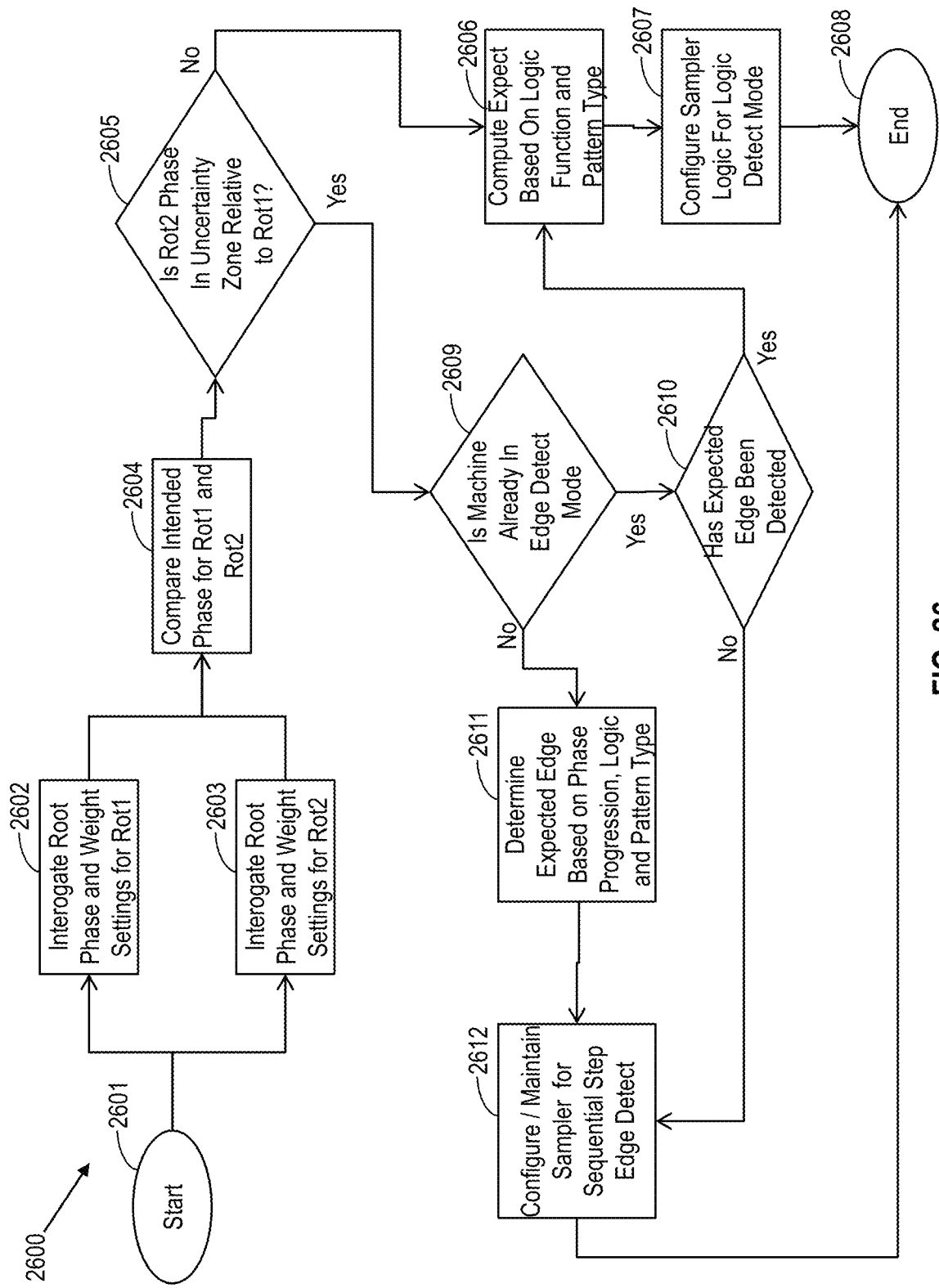
FIGS. 26 and 27 show flows of processes in accordance with aspects of the invention.

FIG. 26 shows a flow 2600 of a process in accordance with aspects of the invention. In particular, the flow 2600 depicts processes in which expect prediction and sampling circuits are set up to operate in a first logic detection mode when the phases are separated so as not to have uncertainty risk, and in a second edge detection mode when phase separation indicates a measurement uncertainty does exist. Flow 2600 starts at step 2601. At steps 2602 and 2603, the phase and weight settings for each of the phase rotators being tested are queried. At step 2604, the phase setting information from steps 2602 and 2603 is compared. At step 2605, it is determined whether a desired position of the second phase relative to the first phase (the sampling phase) is subject to uncertainty. Step 2605 may be performed by determining whether the second phase is in an uncertainty zone in a manner similar to that described with respect to FIG. 25.

When it is determined at step 2605 that the second phase is not in an uncertainty zone, then at step 2606 an expect value is generated based on the logic type and pattern type, the sampler is placed in logic test mode at step 2607, and the sample commences at step 2608. In this mode, the patterning machine can operate with larger steps in phase to sample across regions where uncertainty does not exist.

When it is determined at step 2605 that the second phase is in an uncertainty zone, then at step 2609 it is determined whether the test engine is in logic mode or edge detection mode. If the test engine is not in edge detection mode, the expected edge direction is computed at step 2611 based on present phase, logic type and pattern type, and the machine is configured to edge detection mode at step 2612. Edge detection mode may entail setting up the logic to look for a specific edge type and may further reduce the phase stepping increment to provide a search. After step 2612, the process proceeds to step 2608 in which the machine is returned to do the sample in edge detect mode.

When it is determined at step 2609 that the machine is already in edge-detect mode, then at step 2610 it is determined if the edge has already been detected. If the edge has been detected, the process proceeds to step 2606 since it is safe to return the machine to logic test mode and more course stepping. If, however, the expected edge has not been detected, then the process proceeds to step 2612 where edge detect mode is maintained.

Figure 27:
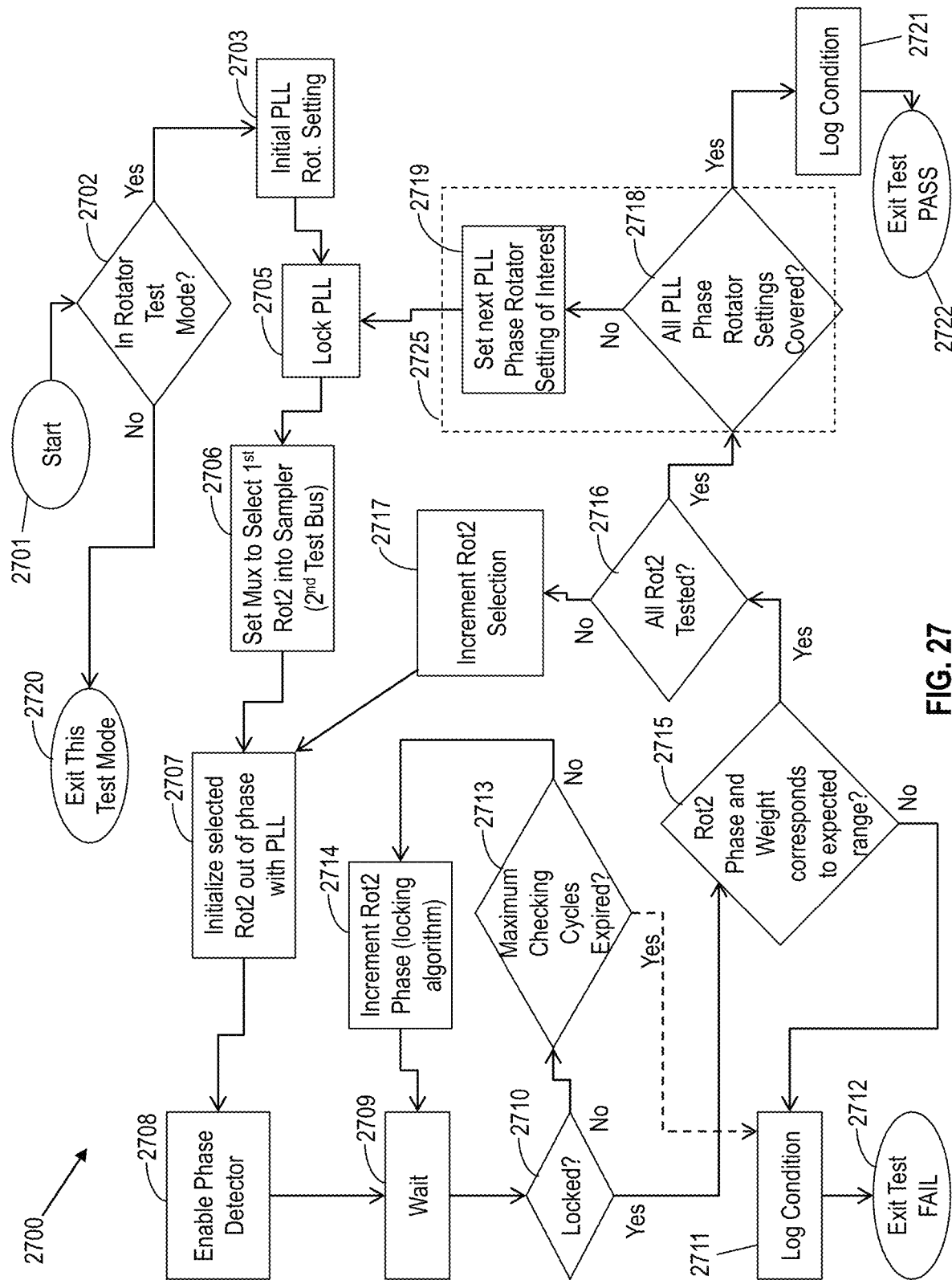

FIG. 27 shows a flow 2700 of a process in accordance with aspects of the invention. In particular, the flow 2700 illustrates a process that can be used for phase rotator test when a phase detector is used as the detection element, e.g., when a phase detector is used as element 1708 in FIG. 17. The process starts at 2701. At step 2702 it is determined whether the phase rotator is in test mode. When the phase rotator is not in test mode, the process ends at step 2720. When the phase rotator is in test mode, then at step 2703 an initial phase setting for the PLL (e.g., PLL 1712 of FIG. 17) is selected. At step 2705, the PLL locks on a phase that will be used as the first test bus phase in structure 1700 of FIG. 17. At step 2706, a phase rotator (second phase rotator Rot2) is selected from the plurality of phase rotators (second plurality) which may connect to the second test bus (e.g., bus 1707 of FIG. 17).

At step 2707, the second phase rotator is set to a phase and weight which are expected to produce an "unlock" indicator in the phase detector. In aspects, the positioning of the initial phase and weight for the second phase rotator are chosen such that multiple iterations of a stepping algorithm must occur before lock. As an example, the initial set point may be chosen such that the phase rotator has to advance 350 degrees to achieve lock.

At step 2708, the phase detector is enabled followed by a wait period at step 2709 to allow the phase detector to achieve a valid output. Following step 2709, the lock indicator is queried at step 2710. When it is determined at step 2710 that the system is unlocked, then at step 2713 the number of iterations through the lock loop is queried. Given the beginning position of the second phase rotator relative to the phase on the first test bus, a limited amount of iterations are used to lock the phase rotator to the first test bus phase. If the limit is exceeded at step 2813, then at step 2811 a fail is logged and the test process ends at step 2712. If, however, the maximum number of iterations has not been exceeded at step 2713, then at step 2714 the phase select and weight for the second phase rotator is updated as part of a lock algorithm, which may be within a functional lock algorithm. The step sequence in the algorithm need not be linear.

After step 2714, the process forwards to step 2709 for a wait state in order to allow the phase detector to evaluate the new phase for lock prior to sampling at step 2710. The loop through steps 2709, 2710, 2813 and 2814 continues until the number of iterations is exhausted or until lock is achieved at step 2710. Once lock is achieved, the process proceeds to step 2715 where the phase-pair and weight selection for the second phase rotator which yields the lock is queried against the position of the reference phase on the first test bus. If the parameters of the second phase rotator are within error bounds, the process forwards to step 2716; however, if the parameters are outside the error bounds, the process forwards to steps 2711 and 2712 for error logging and test exit. An example is an immediate lock prior to initiating the locking loop, notwithstanding an initial parameter setup for the second phase rotator which precluded lock at step 2710.

Still referring to FIG. 27, when the result at step 2715 is positive or true, the process proceeds to step 2716 where it is determined whether all the plurality of phase rotators connected to the second test bus have been tested. If the result at step 2716 is negative or false, the process forwards to step 2717 where the next phase rotator is selected as the second phase rotator and the locking loop repeats. If the result at step 2716 is positive or true, the process forwards to an optional loop 2725 that includes steps 2718 and 2719, which may be performed in a manner similar to steps 1818 and 1819 of FIG. 18. Execution of loop 2725 is dependent on the test coverage achieved for phase-pair selects, weight selects, and phase rotator functionality in the inner two loops. Steps 2721 and 2722 include logging test results and exiting the test.

Figure 28:
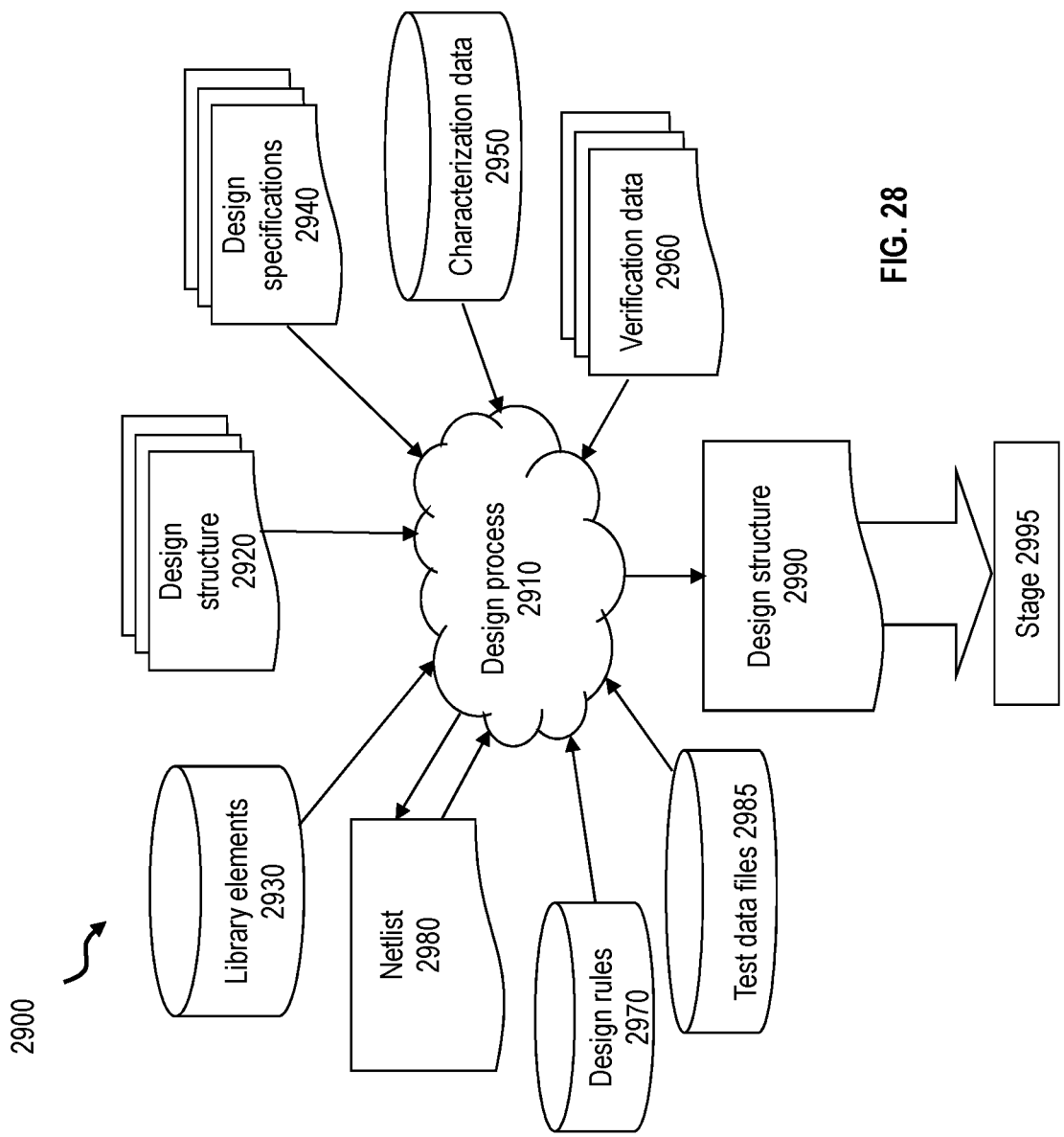
FIG. 28 is a flow diagram of a design process used in semiconductor design, manufacture, and/or test.

FIG. 28 shows a block diagram of an exemplary design flow 2900 used for example, in semiconductor IC logic design, simulation, test, layout, and manufacture. Design flow 2900 includes processes, machines and/or mechanisms for processing design structures or devices to generate logically or otherwise functionally equivalent representations of the design structures and/or devices described above and shown in FIGS. 3, 5, 9-12, 15, 17, and 19. The design structures processed and/or generated by design flow 2900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 2900 may vary depending on the type of representation being designed. For example, a design flow 2900 for building an application specific IC (ASIC) may differ from a design flow 2900 for designing a standard component or from a design flow 2900 for instantiating the design into a programmable array, for example a programmable gate array (PGA) or a field programmable gate array (FPGA) offered by Altera® Inc. or Xilinx® Inc.

FIG. 28 illustrates multiple such design structures including an input design structure 2920 that is preferably processed by a design process 2910. Design structure 2920 may be a logical simulation design structure generated and processed by design process 2910 to produce a logically equivalent functional representation of a hardware device. Design structure 2920 may also or alternatively comprise data and/or program instructions that when processed by design process 2910, generate a functional representation of the physical structure of a hardware device. Whether representing functional and/or structural design features, design structure 2920 may be generated using electronic computer-aided design (ECAD) such as implemented by a core developer/designer. When encoded on a machine-readable data transmission, gate array, or storage medium, design structure 2920 may be accessed and processed by one or more hardware and/or software modules within design process 2910 to simulate or otherwise functionally represent an electronic component, circuit, electronic or logic module, apparatus, device, or system such as those shown in FIGS. 3, 5, 9-12, 15, 17, and 19. As such, design structure 2920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 2910 preferably employs and incorporates hardware and/or software modules for synthesizing, translating, or otherwise processing a design/simulation functional equivalent of the components, circuits, devices, or logic structures shown in FIGS. 3, 5, 9-12, 15, 17, and 19 to generate a Netlist 2980 which may contain design structures such as design structure 2920. Netlist 2980 may comprise, for example, compiled or otherwise processed data structures representing a list of wires, discrete components, logic gates, control circuits, I/O devices, models, etc. that describes the connections to other elements and circuits in an integrated circuit design. Netlist 2980 may be synthesized using an iterative process in which netlist 2980 is resynthesized one or more times depending on design specifications and parameters for the device. As with other design structure types described herein, netlist 2980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 2910 may include hardware and software modules for processing a variety of input data structure types including Netlist 2980. Such data structure types may reside, for example, within library elements 2930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 2940, characterization data 2950, verification data 2960, design rules 2970, and test data files 2985 which may include input test patterns, output test results, and other testing information. Design process 2910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 2910 without deviating from the scope and spirit of the invention. Design process 2910 may also include modules for performing standard circuit design processes such as timing analysis, verification, design rule checking, place and route operations, etc.

Design process 2910 employs and incorporates logic and physical design tools such as HDL compilers and simulation model build tools to process design structure 2920 together with some or all of the depicted supporting data structures along with any additional mechanical design or data (if applicable), to generate a second design structure 2990. Design structure 2990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 2920, design structure 2990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 3, 5, 9-12, 15, 17, and 19. In one embodiment, design structure 2990 may comprise a compiled, executable HDL simulation model that functionally simulates the devices shown in FIGS. 3, 5, 9-12, 15, 17, and 19. Design structure 2990 may also employ a data format used for the exchange of layout data of integrated circuits and/or symbolic data format (e.g. information stored in a GDSII (GDS2), GL1, OASIS, map files, or any other suitable format for storing such design data structures). Design structure 2990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 3, 5, 9-12, 15, 17, and 19. Design structure 2990 may then proceed to a stage 2995 where, for example, design structure 2990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of testing a plurality of phase rotators, comprising:
   connecting a first phase source to a first input of a compare element;
   connecting a second phase source to a second input of the compare element, wherein the second phase source comprises an output of one of the plurality of phase rotators that are selectively connectable to the second input;
   generating an expected value of a phase relationship between the first phase source and the second phase source; and
   comparing the expected value to an output of the compare element.

2. The method of claim 1, wherein the first phase source comprises one of:
   an output of another one of the plurality of phase rotators; and
   an output of a phase locked loop.

3. The method of claim 1, further comprising:
   selecting at least one of a first phase and a first weight for the first phase source; and
   selecting at least one of a second phase and a second weight for the second phase source.

4. The method of claim 1, further comprising repeating the connecting the second phase source, the generating, and the comparing for each one of the plurality of phase rotators.

5. The method of claim 1, wherein the compare element comprises a tunable AND gate.

6. The method of claim 5, further comprising providing a control signal to the tunable AND gate, wherein the control signal provides timing control.

7. The method of claim 5, further comprising providing a control signal to the tunable AND gate, wherein the control signal provides minimum pulse width control.

8. The method of claim 5, further comprising providing a control signal to the tunable AND gate, wherein the control signal provides dead-band control.

9. The method of claim 1, wherein the compare element comprises a phase detector.

10. The method of claim 9, further comprising providing an input to the phase detector that determines sensitivity of the phase detector.

11. The method of claim 9, further comprising providing an input to the phase detector that determines dead-band of the phase detector.

12. The method of claim 1, further comprising logging a pass or a fail based on the comparing the expected value to the output of the compare element.

13. The method of claim 1, wherein the connecting the second phase source comprises controlling a plurality of switches to:
   connect the one of the plurality of phase rotators to the second input; and
   disconnect all of the plurality of phase rotators, other than the one of the plurality of phase rotators, from the second input while the one of the plurality of phase rotators is connected to the second input.

14. The method of claim 1, wherein the first phase source comprises an output of a phase locked loop (PLL) that is separate from the plurality of phase rotators and that is selectively connected to, and disconnected from, the first input using a switch.

15. The method of claim 14, further comprising:
   providing the output of the PLL as input to a test phase rotator; and
   providing an output of the test phase rotator as input to the PLL.

16. The method of claim 1, wherein:
   the compare element receives a control signal separate from the first input and the second input; and
   the compare element comprises tunable logic, and the control signal provides control to the tunable logic including one of: timing control; minimum pulse width control; and dead-band control.

17. A method of testing a plurality of phase rotators, comprising:
- connecting a first phase source to a first input of a compare element, wherein the first phase source comprises an output of one the plurality of phase rotators that are selectively connectable to the first input;
- connecting a second phase source to a second input of the compare element, wherein the second phase source comprises an output of another one the plurality of phase rotators that are selectively connectable to the second input;
- generating an expected value of a phase relationship between the first phase source and the second phase source;
- comparing the expected value to an output of the compare element; and
- logging a pass or a fail based on the comparing the expected value to the output of the compare element.

18. The method of claim 17, further comprising providing a control signal to the compare element, wherein:
- the control signal is separate from the first input and the second input,
- the control signal provides control to tunable logic of the compare element, and
- the control includes one of: timing control; minimum pulse width control; and dead-band control.

19. A method of testing a plurality of phase rotators, comprising:
- connecting an output of a first one of the plurality of phase rotators to a first input of a compare element;
- connecting an output of a second one of the plurality of phase rotators to a second input of the compare element;
- generating an expected value of a phase relationship between the output of the first one of the plurality of phase rotators and the output of the second one of the plurality of phase rotators;
- comparing the expected value to an output of the compare element; and
- determining a pass or a fail based on the comparing.

20. The method of claim 19, further comprising providing a control signal to the compare element, wherein:
- the control signal is separate from the first input and the second input,
- the control signal provides control to tunable logic of the compare element, and
- the control includes one of: timing control; minimum pulse width control; and dead-band control.

* * * * *